United States Patent
Perino et al.

(10) Patent No.: US 6,352,435 B1
(45) Date of Patent: *Mar. 5, 2002

(54) CHIP SOCKET ASSEMBLY AND CHIP FILE ASSEMBLY FOR SEMICONDUCTOR CHIPS

(75) Inventors: Donald V. Perino, Los Altos; Wayne S. Richardson, Cupertino; John B. Dillon, Palo Alto, all of CA (US)

(73) Assignee: Rambus, Inc., Los Altos, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/468,247

(22) Filed: Dec. 20, 1999

Related U.S. Application Data

(62) Division of application No. 08/887,567, filed on Jul. 3, 1997, now Pat. No. 6,007,357, which is a continuation of application No. 08/452,120, filed on May 26, 1995, now abandoned.

(51) Int. Cl.[7] .............................................. H01R 13/62

(52) U.S. Cl. ............................ 439/73; 439/331; 439/91

(58) Field of Search ................................. 439/325–327, 439/330, 331, 260, 267, 91

(56) References Cited

U.S. PATENT DOCUMENTS

| | | |
|---|---|---|
| 3,874,768 A | 4/1975 | Cutchaw |
| 4,199,637 A | 4/1980 | Sado |
| 4,426,689 A | 1/1984 | Henle et al. |
| 4,586,764 A | 5/1986 | Mullen, III et al. |
| 4,598,962 A | 7/1986 | Reitz et al. |
| 4,598,972 A | 7/1986 | Mullen, III et al. |

(List continued on next page.)

FOREIGN PATENT DOCUMENTS

| | | |
|---|---|---|
| DE | 3611346 | 10/1987 |
| DE | 4221017 A1 | 1/1993 |
| EP | 0472203 A1 | 2/1992 |
| EP | 0542433 A2 | 5/1993 |
| FR | 2109444 | 5/1972 |
| GB | 2276502 A | 9/1994 |

(List continued on next page.)

OTHER PUBLICATIONS

"Inexpensive Chip Package" IBM Technical Diclosure Bulletin, vol. 33, No. 1 A, pp. 272–273 (Jun. 1990).

Brearley, Jr., D. "The Connector PCB/Interface Key to Success in Surface Mounting of Connectors," N.E.P. and Production Conference, pp. 427–434 (Feb. 25–27, 1986).

Brearley, Jr., D. "The Connector PCB/Interface Key to Success in Surface Mounting of Connectors," Microelectronics Journal, vol. 17, No. 3, pp. 14–20 (Benn Elect. Publ. 1986).

(List continued on next page.)

*Primary Examiner*—Gary Paumen
(74) *Attorney, Agent, or Firm*—Lee & Hayes, PLLC

(57) ABSTRACT

A chip socket assembly provides for the mechanical and electrical coupling of edge-mountable chips to a bus of a circuit board with relative ease. An edge-mountable chip may be placed in a slot defined by a base. A clip may be attached to the base to retain the chip in the base. Alternatively, the base and the package of the chip may be configured such that the chip mates with the base in retaining the chip in the base. With the chip socket assembly, users may add, remove, or replace single chips and therefore expand the functionality of a system with the granularity of a single chip in a relatively easy manner. A chip file assembly may also be used to provide for the mechanical and electrical coupling of a plurality of edge-mountable chips to a bus of a circuit board with relative ease. Assemblies for securing horizontal chip packages are also described.

13 Claims, 14 Drawing Sheets

U.S. PATENT DOCUMENTS

| | | | |
|---|---|---|---|
| 4,636,022 A | 1/1987 | Sonobe | |
| 4,798,541 A | 1/1989 | Porter | |
| 4,850,892 A | 7/1989 | Clayton et al. | |
| 4,891,023 A | 1/1990 | Lopata | |
| 4,967,262 A | 10/1990 | Farnsworth | |
| 4,975,763 A | 12/1990 | Bandouin et al. | |
| 5,002,494 A | 3/1991 | Olsson | |
| 5,104,324 A | 4/1992 | Grabbe et al. | |
| 5,120,238 A | 6/1992 | Marks et al. | |
| 5,163,837 A | 11/1992 | Rowlette, Sr. | |
| 5,214,563 A | 5/1993 | Estes | |
| 5,260,601 A | 11/1993 | Baudouin et al. | |
| 5,292,265 A * | 3/1994 | Chen et al. | 439/326 |
| 5,340,318 A * | 8/1994 | Kunihiro | 439/91 |
| 5,431,571 A * | 7/1995 | Hanrahan et al. | 439/91 |
| 5,432,678 A | 7/1995 | Russell et al. | |
| 5,569,045 A | 10/1996 | Hsu | |
| 5,833,478 A * | 11/1998 | Tseng et al. | 439/326 |

FOREIGN PATENT DOCUMENTS

| | | |
|---|---|---|
| JP | 55138264 | 10/1980 |
| JP | 5931217 | 7/1984 |
| JP | 1166545 | 6/1989 |
| JP | 5251141 | 6/1991 |
| WO | 9318559 | 9/1993 |

OTHER PUBLICATIONS

Choudhury, M.A. "Fasteners Take on New Shapes," Electronic Packaging & Production, pp. 58–59 (May 1986).

Goel, R.P. "Greater Packaging Density Through Direct Surface Mounting of Components," pp. 17–20 (Dec. 1986).

Janota, N. et al., "Connectorization of Surface–Mount PC Boards," Design News, pp. 88–90 (Jun. 16, 1986).

Timmins, D.L. "An Elastomeric Interconnect System for Fine Pitch Leadless Chip Carriers," IEEE 34th Electronic Components Conference, pp. 138–143 (May 14–16, 1984).

Gates, M. "Supporting the Surface Mounting Switchover," New Electronics, pp. 63, 65, 67 (Jun. 26, 1984).

Cook, R. "More Memory in Less Space," Byte Magazine, pp. 197, 198, 200 (Jun. 1995).

Bearley, Jr., D. "Assuring Realiability of Surface Mounted Connectors," National Electronic Packaging and Production Conference, vol. 2, pp. 606–614 (Feb. 25–27, 1986).

\* cited by examiner

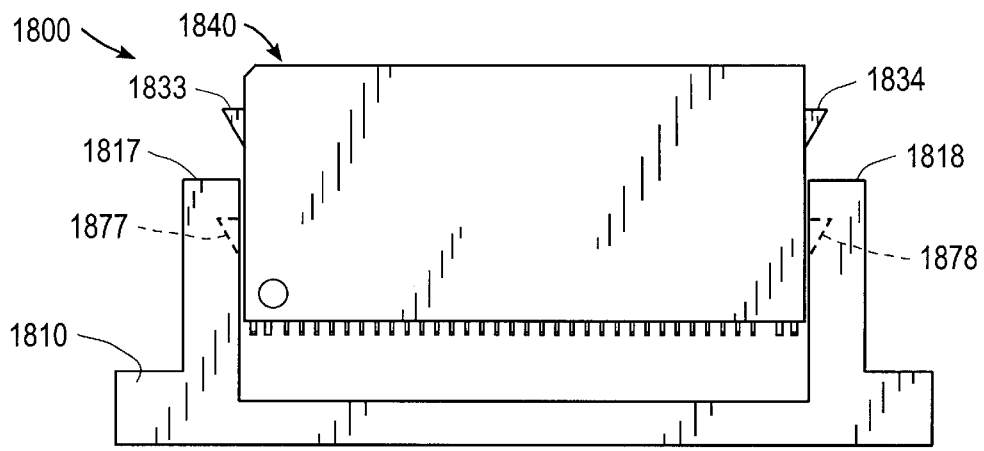
FIG. 18
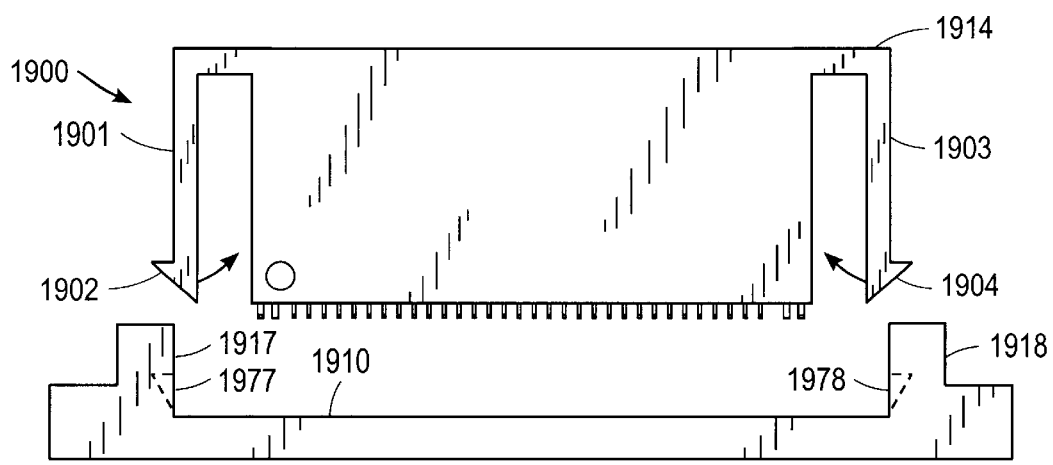
FIG. 19
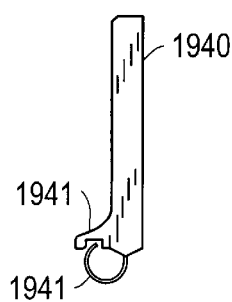
FIG. 20
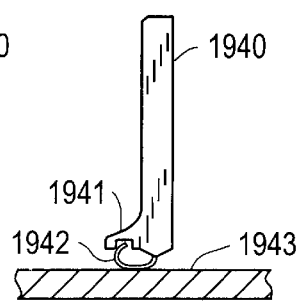
FIG. 21
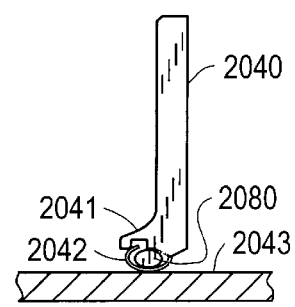
FIG. 22
FIG. 23

CHIP SOCKET ASSEMBLY AND CHIP FILE ASSEMBLY FOR SEMICONDUCTOR CHIPS

The present application is a divisional application of U.S. Pat. application Ser. No. 08/887,567 filed Jul. 3, 1997, now U.S. Pat. No. 6,007,357 issued Dec. 28, 1999, which is a continuation of U.S. patent application Ser. No. 08/452,120 filed May 26, 1995 now abandoned.

FIELD OF THE INVENTION

The present invention relates generally to the field of chip connectors. More particularly, the present invention relates to the field of chip connectors for mounting chips on circuit boards.

BACKGROUND OF THE INVENTION

A semiconductor device is typically packaged as a chip and mounted on a circuit board to mechanically and electrically connect the semiconductor device to the circuit board. This allows semiconductor device to be electrically connected to various other electrical devices within a digital data processing system.

One known package type is a surface vertical package ("SVP"), which provides for the edge-mounting of chips to circuit boards. The semiconductor device is packaged in a relatively flat package such that the leads that provide for electrical connections to the semiconductor device are positioned on one edge of the chip. Each lead of the SVP chip may be soldered to a respective solder pad on a circuit board to mechanically and electrically connect the semiconductor device to the circuit board. The leads of the SVP chip are bent substantially perpendicular relative to the SVP package so that the SVP chip may be placed upright over the circuit board in soldering each lead to its respective solder pad. The SVP chip may have at its bottom edge supporting pins, for example, to help the SVP chip stand upright in soldering the SVP chip to the circuit board.

In soldering the SVP chip to the circuit board the SVP chip may nevertheless fall over, for example by the mechanical movement of the circuit board through a solder oven, and thus have to be resoldered to the circuit board. Even after soldering the SVP chip to the circuit board, the electrical connection between the SVP chip and the circuit board must be tested to ensure that each lead of the SVP chip has been properly aligned with and soldered to its respective solder pad on the circuit board. If the SVP chip has not been suitably soldered to the circuit board, the SVP chip must be resoldered.

Furthermore, the solder connection between the SVP chip and the circuit board may deteriorate during the life of the circuit board, for example by being subjected to various mechanical stresses. Typical users may not have the equipment or know-how to resolder a SVP chip to the circuit board and subsequently test the resulting electrical connection. Thus, a user could be inconvenienced and subjected to the cost of having to replace the circuit board or having someone else resolder a SVP chip to the circuit board.

Another known package type is a surface horizontal package ("SHP"), which provides for the horizontal mounting of an integrated circuit chip to the circuit board. The integrated circuit is mounted inside a thin plastic package of the SHP and connected to metal leads residing on one of the four of the thin sides of the plastic package of the SHP. The SHP chip has pins on an opposite side of the plastic package for aligning and mounting the chip. The metal leads of the SHP are soldered to metallic lines on a circuit board.

The connection of an SHP chip to a circuit board shares some of the same problems as the connection of an SVP chip to a circuit board. Leads of the SHP can be difficult to properly solder. The electrical connection with respect to the soldered leads must be tested, and an SHP must be resoldered if the solder connection is defective. Moreover, even good soldered leads of the SHP can deteriorate over time.

Users of computers or other electrical systems are typically unable to expand the functionality of the system with the granularity of a single soldered SVP chip or soldered SHP chip in a relatively easy manner. Typical digital data processing systems with soldered SVP or SHP chips on circuit boards provide for user-expansion capabilities with the granularity of a circuit board, rather than of a chip. Only by adding, removing, or replacing an entire circuit board can the user easily add or remove the functionality of a single chip.

SUMMARY AND OBJECTS OF THE INVENTION

One object of the present invention is to provide for the mechanical and electrical connection of a chip to a circuit board without requiring that the chip be soldered to the circuit board.

Another object of the present invention is to provide for the capability for users to mechanically and electrically couple chips to a circuit board with relative ease.

Another object of the present invention is to provide for the capability for users to remove chips from a circuit board with relative ease.

Another object of the present invention is to provide for the capability for users to replace chips mechanically and electrically coupled to a circuit board in a relatively easy manner.

Another object of the present invention is to provide for the capability for users to expand the functionality of a system with the granularity of a single chip in a relatively easy manner.

Another object of the present invention is to provide for a relatively low inductance connection in mechanically and electrically coupling chips to a circuit board.

A chip socket assembly is described. The chip socket assembly comprises a base having a top, a bottom, and a connector. The base defines a slot for receiving at the top of the base an edge of a chip and for guiding the edge of the chip to the bottom of the base. The chip socket assembly also comprises a clip configured to mate with the connector of the base for retaining the chip in the base when mating with the connector of the base.

A system is described that comprises a circuit board having a surface and having a bus on the surface and a base coupled to the surface of the circuit board over the bus. The base has a top and a bottom, and the base defines a slot over the bus for receiving at the top of the base an edge of a chip and for guiding the edge of the chip to the bottom of the base and over the bus.

A chip file assembly is described that comprises a base having a top, a bottom, and a plurality of connectors. The base defines a plurality of slots for receiving at the top of the base edges of a plurality of chips and for guiding the edges of the chips to the bottom of the base. The chip file assembly also comprises a plurality of clips configured to mate with the connectors of the base for retaining the chips in the base when mating with the connectors of the base.

Another system is described that comprises a circuit board having a surface and having at least one bus on the surface and a base coupled to the surface of the circuit board over the at least one bus. The base has a top and a bottom, and the base defines a plurality of slots over the at least one bus for receiving at the top of the base edges of a plurality of chips and for guiding the edges of the chips to the bottom of the base and over the at least one bus.

Another chip socket assembly is described that comprises a base having a top and a bottom. The base defines a slot for receiving at the top of the base an edge of a chip and for guiding the edge of the chip to the bottom of the base. The base has a clip portion configured to mate with the chip for retaining the chip in the base when the chip is placed in the slot of the base.

A chip package is described. The chip package includes packaging material that contains an integrated circuit. The packaging material has a bottom-facing housing that extends laterally from the packaging material. A lead extends from a bottom of the packaging material. The lead has a substantially C-shaped form. An end of the lead resides within the housing when the lead is compressed.

An assembly is also described. The assembly includes a horizontal chip package, a socket, and a frame. The horizontal chip package includes a member on a side of the horizontal chip package. The socket receives the horizontal chip package. The socket is coupled to a circuit board having a first conductive region. The socket includes a guiding surface for guiding the member of the horizontal chip package in an angled downward direction. The frame is configured to mate with the socket to secure the horizontal chip package in the socket. A lead of the horizontal chip package is electrically coupled to the first conductive region of the circuit board when the frame secures the horizontal chip package in the socket.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which:

FIG. 18 is a view of a chip socket assembly with a chip with side tabs;

FIG. 19 shows a vertical chip with side clips;

FIG. 20 is a side view of an edge-mountable chip with C-shaped compressible leads before compression;

FIG. 21 is a side view of an edge-mountable chip with C-shaped compressible leads after compression;

FIG. 22 is a side view of an edge-mountable chip with C-shaped compressible leads with an elastomer center before compression;

FIG. 23 is a side view of an edge-mountable chip with C-shaped compressible leads with an elastomer center after compression;

DETAILED DESCRIPTION

The following detailed description sets forth embodiments of chip socket assemblies and chip file assemblies for semiconductor chips.

Figure 1:
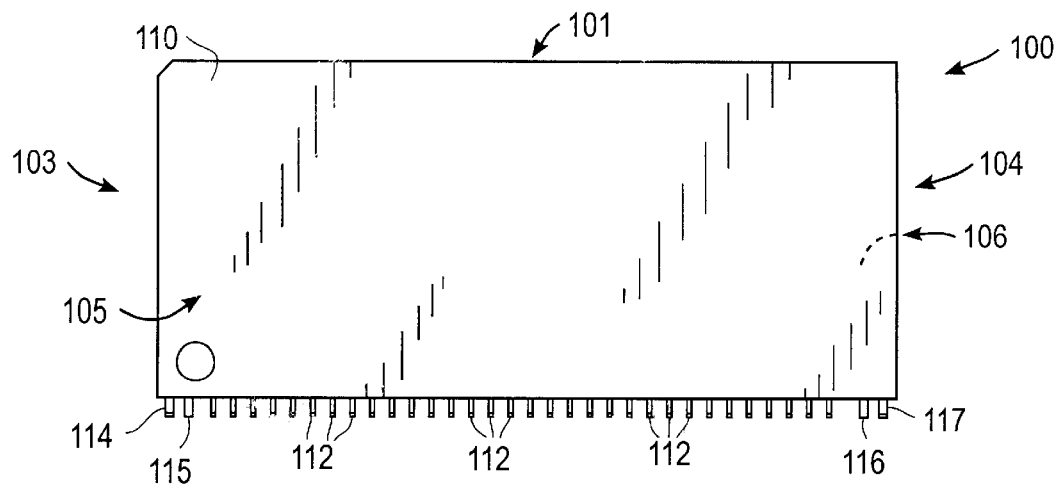
FIG. 1 is a front view of a chip having a surface vertical package (SVP)
Figure 2:
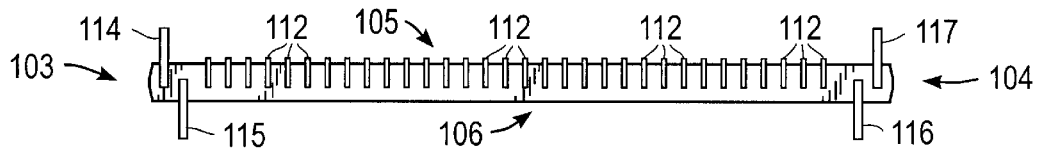
FIG. 2 is a bottom view of the chip of FIG. 1.

FIG. 1 illustrates a front view of prior art chip 100. Chip 100 has a top 101, a bottom 102 opposite top 101, a left side 103, a right side 104 opposite left side 103, a front 105, and a rear 106 opposite front 105. FIG. 2 illustrates a bottom view of prior art chip 100.

Chip 100 is an edge-mountable chip and has an electrical device packaged in a surface vertical package ("SVP") 110 that is approximately 433 mils in height from top 101 to bottom 102, approximately 984 mils in width from left side 103 to right side 104, and approximately 47 mils in thickness from front 105 to rear 106.

Chip 100 includes thirty-two leads 112 that provide for an electrical connection to an electrical device packaged in chip 100. Leads 112 are each approximately 13 mils in width from left to right, and the centers of leads 112 are spaced approximately 26 mils away from each other. The centers of the first and last of leads 112 are each at a maximum distance of approximately 102 mils from left side 103 and right side 104, respectively. The centers of the first and last of leads 112 are approximately 793 mils apart from one another. Leads 112 each extend approximately 20 mils downward from bottom 102 and are bent substantially perpendicular to extend approximately 30 mils toward front 105.

Chip 100 further includes four support pins 114, 115, 116, and 117 to help support chip 100 in standing upright on bottom 102. Each support pin 114–117 is approximately 20 mils in width and extends approximately 20 mils downward from bottom 102. The center of support pin 114 is located approximately 35 mils to the left of the right edge of support pin 115. Support pin 115 is located to the left of leads 112. Support pin 114 is bent substantially perpendicular to extend toward front 105. Support pin 115 is bent substantially perpendicular to extend toward rear 106. Support pins 114 and 115 together span a maximum distance of approximately 150 mils from front 105 to rear 106. The center of support pin 117 is located approximately 35 mils to the right of the left edge of support pin 116. Support pin 116 is located to the right of leads 112. Support pin 117 is bent substantially perpendicular to extend toward front 105. Support pin 116 is bent substantially perpendicular to extend toward rear 106. Support pins 116 and 117 together span a maximum distance of approximately 150 mils from front 105 to rear 106. The center point between support pins 114–115 is approximately 913 mils apart from the center point between support pins 116–117.

Figure 3:
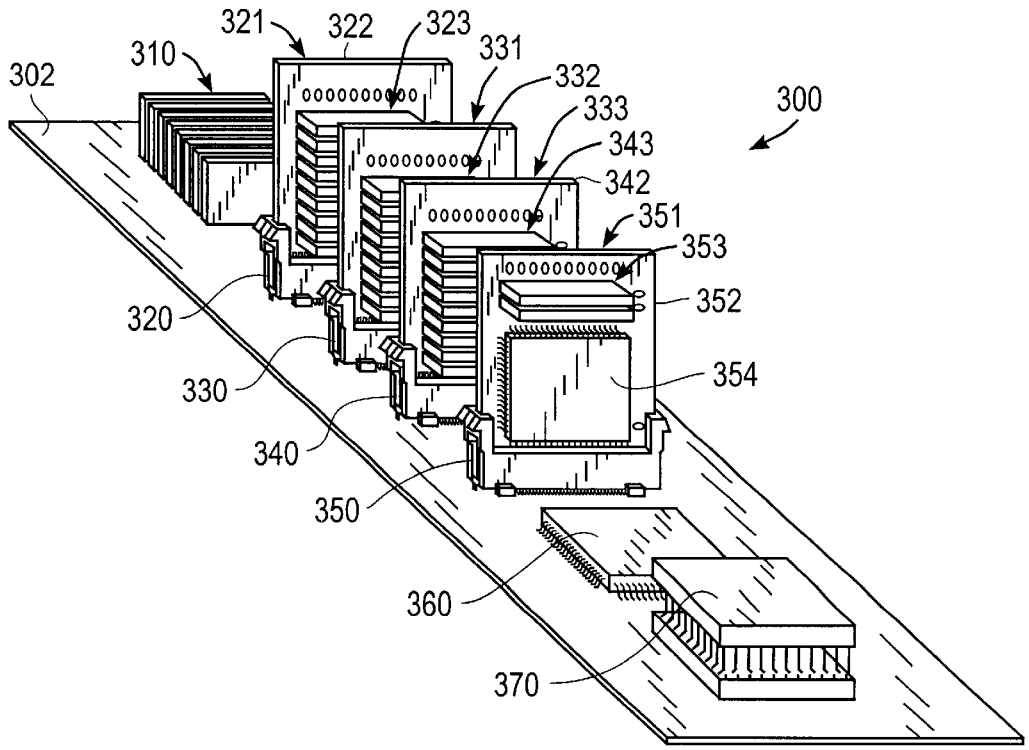
FIG. 3 is a perspective view of a system having the chip of FIG. 1.

FIG. 3 illustrates a perspective view of a prior art digital data processing system 300. System 300 includes a circuit board 302. System 300 also includes a set of eight dynamic random access memory ("DRAM") chips 310, four expansion sockets 320, 330, 340, and 350, an application specific integrated circuit ("ASIC") chip 360, and a central processing unit ("CPU") chip 370. Prior art DRAM chips 310, expansion sockets 320, 330, 340, and 350, ASIC chip 360, and CPU chip 370 are mounted on prior art circuit board 302 and are electrically coupled to one another along a primary channel of system 300.

System 300 also includes prior art modules 321, 331, 341, and 351. Modules 321, 331, 341, and 351 comprise respective circuit boards 322, 332, 342, and 352 plugged into respective expansion sockets 320, 330, 340, and 350. Modules 321, 331, and 341 are memory modules and each includes a set of nine DRAM chips 323, 333, and 343, respectively. Each set of DRAM chips 323, 333, and 343 is mounted on circuit board 322, 332, and 342, respectively, and is electrically coupled to the primary channel of system 300. DRAM chips 323 are electrically coupled to one another along a secondary channel of system 300. DRAM chips 333 are electrically coupled to one another along a secondary channel of system 300. DRAM chips 343 are electrically coupled to one another along a secondary channel of system 300. Module 351 includes a set of two DRAM chips 353 and an ASIC chip 354. DRAM chips 353 and ASIC chip 354 are mounted on circuit board 352 and are electrically coupled to the primary channel of system 300. DRAM chips 353 and ASIC chip 354 are electrically coupled to one another along a secondary channel of system 300.

Each DRAM chip of sets 310, 323, 333, 343, and 353 is packaged in a SVP package, such as the chip package 100 of FIGS. 1 and 2. To mechanically and electrically connect such DRAM chip packages to their respective circuit boards, the leads of each DRAM chip package are each typically soldered. The supporting pins of the DRAM chip help to support the DRAM chip in standing upright while soldering the DRAM chip to the circuit board.

In soldering the DRAM chip to the circuit board, the DRAM chip may nevertheless fall over and thus have to be resoldered to the circuit board. Even after soldering the DRAM chip to the circuit board, the electrical connection between the DRAM chip and the circuit board should be tested to ensure each lead of the DRAM chip has been properly aligned with and soldered to its respective solder pad on the circuit board.

The solder connection between the DRAM chip and the circuit board may deteriorate sometime during the life of the circuit board being subjected to various mechanical stresses.

Users are also unable to expand the functionality of system 300 with the granularity of a single chip in a relatively easy manner. System 300 provides for user-expansion capabilities with the granularity of a circuit board, for example by inserting circuit boards into and removing circuit boards from expansion slots 320, 330, 340, and 350. But DRAM chips 310, 323, 333, 343, and 353 are soldered to circuit boards 302, 321, 331, 341, and 351.

Figure 4:
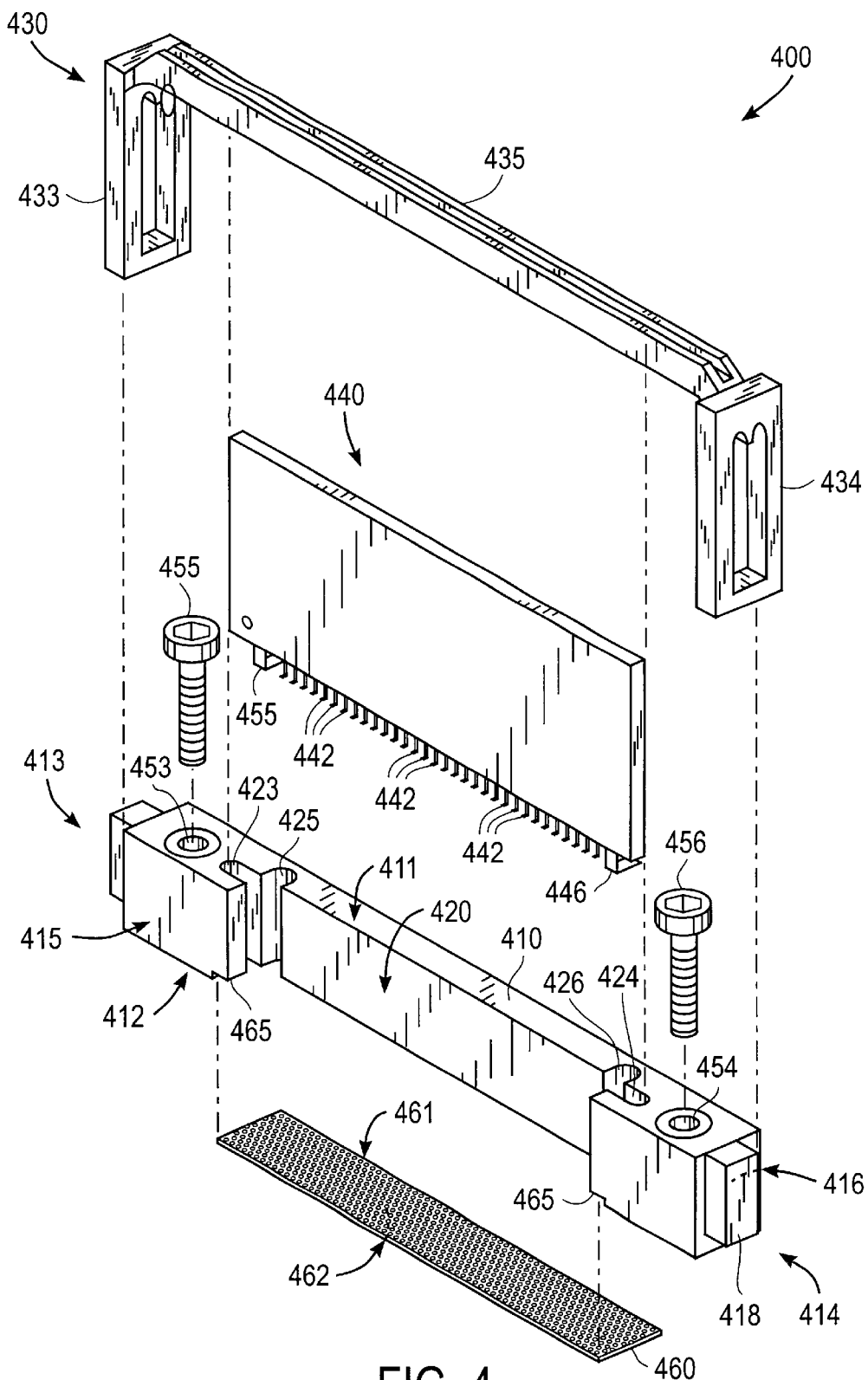
FIG. 4 is an exploded, perspective view of one chip socket assembly.
Figure 6:
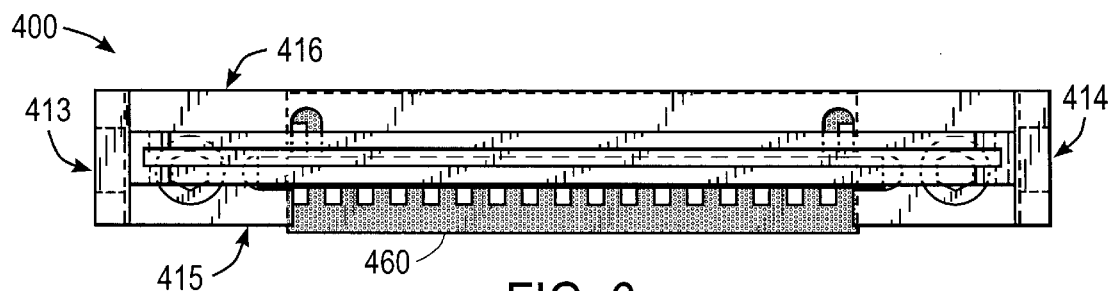
FIG. 6 is a top view of the chip socket assembly of FIG. 5.
Figure 7:
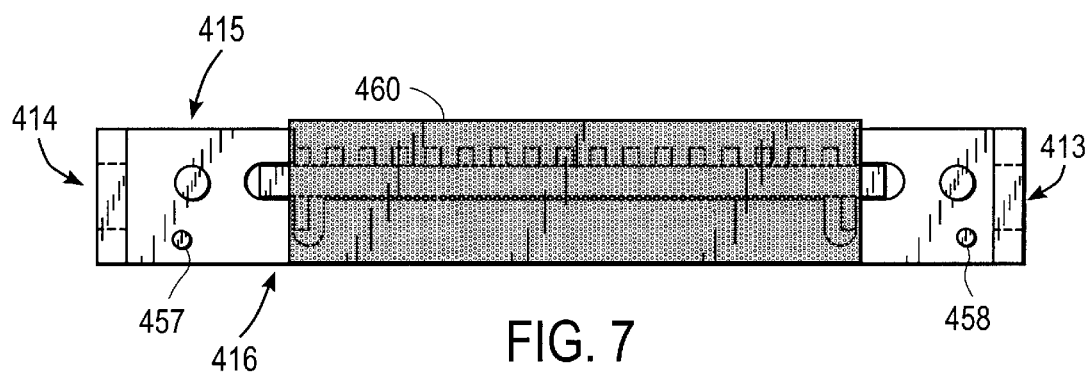
FIG. 7 is a bottom view of the chip socket assembly of FIG. 5.
Figure 5:
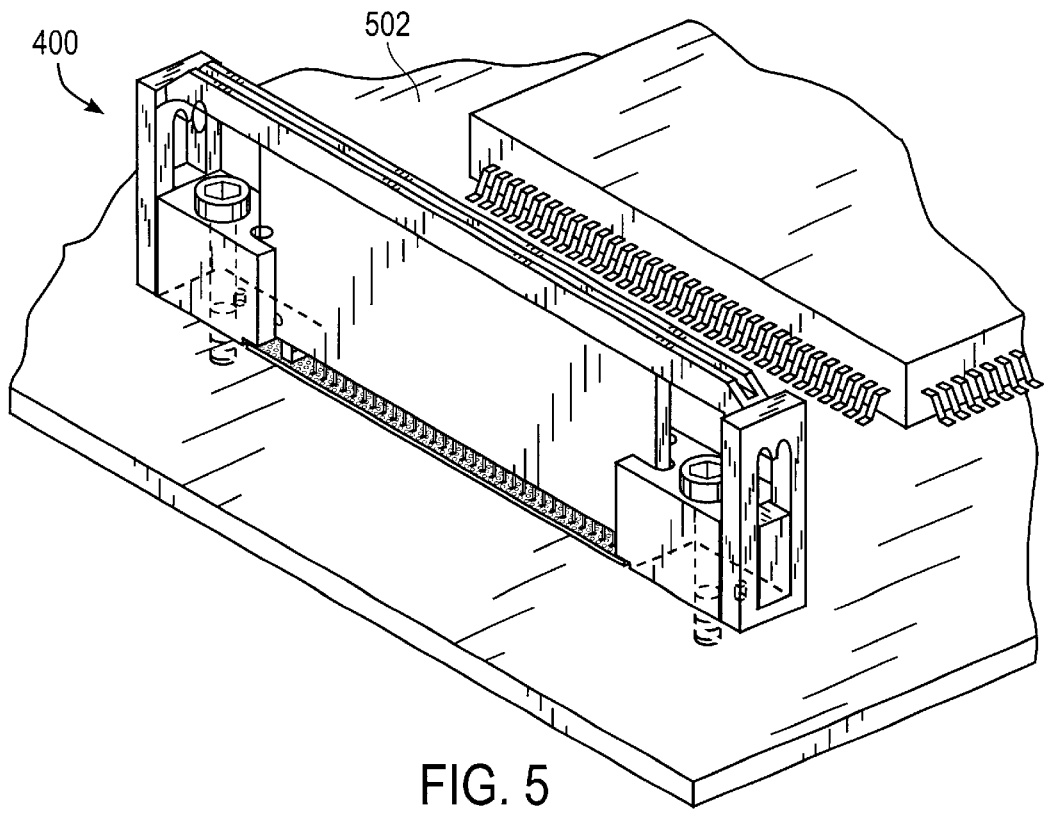
FIG. 5 is a perspective view of the chip socket assembly of FIG. 4 mechanically and electrically coupling a chip to a circuit board.

FIG. 4 illustrates an exploded, perspective view of a chip socket assembly 400, which is one embodiment of the present invention. Chip socket assembly 400 is also referred to as a device, an apparatus, or a chip socket, for example. Chip socket assembly 400 may be used to mechanically and electrically couple a chip 440 to a bus of a circuit board 502 as illustrated in FIG. 5. FIG. 6 illustrates a top view of chip socket assembly 400. FIG. 7 illustrates a bottom view of chip socket assembly 400. Chip socket assembly 400 includes a base 410 for receiving and guiding chip 440 and also includes a retaining clip 430 for helping to retain chip 440 in base 410.

Base 410 has a top 411, a bottom 412 opposite top 411, a left side 413, a right side 414 opposite left side 413, a front 415, and a rear 416 opposite front 415. Base 410 may have any suitable dimensions that may depend, for example, on the dimensions of chip 440. For one embodiment, base 410 may have a thickness from front 415 to rear 416 in the range of approximately 200 mils to approximately 250 mils, for example, a width from left side 413 to right side 414 in the range of approximately 1450 mils to approximately 1500 mils, for example, and a height from top 411 to bottom 412 of approximately 200 mils, for example. Base 410 may be formed from any suitable material, such as a plastic or metal, for example. Base 410 may be formed with a suitable material so as to serve as a heat sink in coupling chip 440 to circuit board 502. Base 410 may be formed so as to conduct heat into circuit board 502, for example.

Base 410 defines a slot 420 configured to receive and guide chip 440. Chip 440 includes an electrical device packaged in an edge-mountable package. Although illustrated in FIGS. 4–7 as being packaged in a surface vertical package (SVP) similar to chip 100 of FIGS. 1 and 2, chip 440 may be packaged in any suitable edge-mountable package, for example. Chip 440 may include any suitable electrical device configured in any suitable form. Chip 440 may include DRAM memory configured as an integrated circuit, for example. Chip 440 may include digital data processing circuitry configured as an integrated circuit, for example.

Chip 440 has thirty-two leads 442 and two support pins 445–446. For alternative embodiments, Chip 440 has other suitable numbers of leads 442 and support pins 445–446. Leads 442 correspond to leads 112 of chip 100 of FIGS. 1 and 2. Support pins 445 and 446 correspond to support pins 115 and 116 of chip 100 of FIGS. 1 and 2. For other embodiments (not shown), Chip 440 does not have outermost support pins 445 and 446—they are either removed or not put into Chip 440 to begin with.

Slot 420 has an opening at top 411 and an opening at bottom 412. Slot 420 also has a left end 423 and a right end 424 opposite left end 423. Slot 420 is configured to receive at top 411 the bottom of chip 440 and to guide chip 440 to bottom 412, exposing at bottom 412 leads 442 of chip 440 as illustrated in FIG. 5. Slot 420 may have any suitable dimensions that may depend, for example, on the dimensions of chip 440. For one embodiment, slot 420 may have a length from left end 423 to right end 424 in the range of approximately 1000 mils to approximately 1100 mils, for example, and a width from front to rear of approximately 50 mils, for example.

Slot 420 also includes left support pin guide 425 and right support pin guide 426. Left support pin guide 425 is configured to receive and guide support pin 445 of chip 440 as chip 440 is placed in slot 420. Right support pin guide 426 is configured to receive and guide support pin 446 of chip 440 as chip 440 is placed in slot 420. Support pin guides 425 and 426 in conjunction with support pins 445 and 446 may help to align exposed leads 442 at bottom 412 with respect to slot 420, as illustrated in FIGS. 6 and 7.

As illustrated in FIG. 5, base 410 exposes at front 415 at least a portion of slot 420, exposing at least a portion of the front of chip 440 at front 415 when chip 440 has been placed in slot 420. Base 410 may also be configured to define slot 420 such that base 410 has a continuously solid side at front 415.

Clip 430 helps to retain chip 440 in slot 420. Clip 430 and base 410 may be configured to mate with one another in any suitable manner to help retain chip 440 in slot 420. For one embodiment, base 410 includes knobs or protuberances 417 and 418 configured to mate with clip 430.

Protuberance 417 is located at the end of base 410 at left side 413. Protuberance 417 may have any suitable shape and dimensions. As one example, protuberance 417 may have a width from front 415 to rear 416 of approximately 125 mils, for example, a height from top 411 to bottom 412 of approximately 150 mils, for example, and a thickness from left to right of approximately 50 mils, for example. Protuberance 418 is located at the end of base 410 at right side 414. Protuberance 418 may have any suitable shape and dimensions. As one example, protuberance 418 may have a width from front 415 to rear 416 of approximately 125 mils, for example, a height from top 411 to bottom 412 of approximately 150 mils, for example, and a thickness from left to right of approximately 50 mils, for example.

Clip 430 may have any suitable shape and dimensions that may depend, for example, on the shape and dimensions of protuberances 417 and 418, base 410, and chip 440. Clip 430 may be formed from any suitable material, such as a plastic or metal, for example. Clip 430 may be formed with a suitable material so as to serve as an integral heat sink in coupling chip 440 to circuit board 502. Clip 430 may also be configured so as to serve as a shipping and handling device for chip socket assembly 400. For an alternative embodiment, clip 430 is molded as an integral part of the package for chip 440.

For one embodiment, clip 430 includes a left connector 433 having an opening to mate with protuberance 417 and also includes a right connector 434 having an opening to mate with protuberance 418. Clip 430 includes a bridge structure 435 connecting left connector 433 and right connector 434. When clip 430 is connected to mate with base 410, bridge structure 435 overlies chip 440 and helps to retain chip 440 in base 410, as illustrated in FIGS. 5 and 6.

In mechanically and electrically coupling chip 440 to circuit board 502, as illustrated in FIG. 5, base 410 is coupled or fastened to circuit board 502 over suitable pads or other suitable electrical connectors of a bus to which chip 440 is to be electrically coupled. Base 410 may be coupled or fastened to circuit board 502 in any suitable manner using any suitable structures and techniques.

For one embodiment, base 410 may include a left opening 453 and a right opening 454, as illustrated in FIG. 4, for coupling base 410 to circuit board 502. Left opening 453 is located near left side 413 between protuberance 417 and left end 423 of slot 420. Left opening 453 may receive and guide a bolt or screw 455 to pass from top 411 through base 410 to bottom 412. Right opening 454 is located near right side 414 between protuberance 418 and right end 424 of slot 420. Right opening 454 may receive and guide a bolt or screw 456 to pass from top 411 through base 410 to bottom 412. Left and right openings 453 and 454 may be positioned in other suitable locations of base 410. Circuit board 502 may be configured with suitable openings to mate with bolts or screws 455 and 456 in fastening base 410 to circuit board 502, as illustrated in FIG. 5. For other embodiments, other suitable fasteners such as glue or rivets, for example, may be used to couple base 410 to circuit board 502.

To help align leads 442 of chip 440 with the bonding pads or other suitable electrical connectors for a bus to which chip 440 is to be electrically coupled, base 410 may include one or more suitable alignments pins for aligning base 410 with respect to the bus to help provide for a suitable electrical connection between chip 440 and the bus of circuit board 502. Although the use of bolts, screws, or rivets, for example, help to align base 410 with respect to the bus of circuit board 502 in fastening base 410 to circuit board 502, alignment pins help to ensure leads 442 are suitably aligned within the relatively tighter tolerances required in aligning leads 442 with the bus of circuit board 502.

For one embodiment, base 410 may include alignment pins 457 and 458 as illustrated in FIGS. 5 and 7. Alignment pin 457 protrudes from bottom 412 near left side 413 between protuberance 417 and left end 423 of slot 420. Alignment pin 458 protrudes from bottom 412 near right side 414 between protuberance 418 and right end 424 of slot 420. Alignment pins 457 and 458 may be positioned in other suitable locations of base 410. Circuit board 502 may be configured with suitable openings to mate with alignment pins 457 and 458 so as to help ensure leads 442 of chip 440 are suitably aligned with the bus of circuit board 502. For other embodiments, circuit board 502 may be configured with suitable alignment pins to mate with suitable openings in base 410 to help align leads 442 of chip 440 with the bus of circuit board 502.

The package of chip 440 may be used to help align leads 442 with the bus of circuit board 502 by controlling the length of slot 420 and the positioning of leads 442 with respect to the package of chip 440. For other embodiments, the positioning of support pins 445 and 446 with respect to leads 442 may be controlled. Support pin guides 425 and 426 in conjunction with support pins 445 and 446 may then help to align leads 442 of chip 440 with the bus of circuit board 502, as illustrated in FIGS. 6 and 7.

Once chip 440 is placed in slot 420 and aligned with the bus of circuit board 502, clip 430 may be coupled to base 410 to help retain chip 440 in base 410. Clip 430 may also be configured to mate with base 410 such that bridge structure 435 applies pressure over the top of chip 440 to maintain the electrical connection between leads 442 and the bus of circuit board 502.

For one embodiment, leads 442 of chip 440 may be placed directly over the bus of circuit board 502. For other embodiments, a suitable conductive interconnect may be used between leads 442 and the bus of circuit board 502. As one example, an elastomeric connector sheet 460, also called an anisotropic conductor sheet, may be configured between chip 440 and the bus of circuit board 502 so as to provide for a suitable electrical connection between leads 442 and the bus of circuit board 502. Elastomeric connector sheet 460 has a top 461 and a bottom 462. Elastomeric connector sheets are available under the name of MAF Inter-connector from Shin-Etsu Polymer America, Inc. of Union City, Calif., for example.

Elastomeric connector sheet 460 conducts electrical signals only in a substantially vertical direction between top 461 and bottom 462. Elastomeric connector sheet 460 provides for a relatively low inductance connection between leads 442 and the bus of circuit board 502. Elastomeric connector sheet 460 provides for relatively minimized signal degradation and may be used for relatively high frequencies in conducting electrical signals between leads 442 and the bus of circuit board 502. Elastomeric connector sheet 460 may therefore provide for relatively accurate testing of chip 440.

Elastomeric connector sheet 460 may have any suitable shape and any suitable dimensions. As one example, elastomeric connector sheet 460 may be rectangular in shape. Elastomeric connector sheet 460 may have a length from left to right in the range of approximately 1000 mils to approximately 1100 mils, for example, a width from front to rear of approximately 200 mils, for example, and a thickness from top 461 to bottom 462 in the range of approximately 5 mils to approximately 50 mils, for example.

Elastomeric connector sheet 460 may be mounted between chip 440 and the bus of circuit board 502 in any suitable manner using any suitable technique. As elastomeric connector sheet 460 conducts electrical signals only in substantially vertical directions between top 461 and bottom 462, elastomeric connector sheet 460 may be mounted between chip 440 and the bus of circuit board 502 with minimized concern for electrical shorts, for example, despite accidental electrical contacts made between elastomeric connector sheet 460 and other conductive structures of chip socket assembly 400, for example, bolts or screws 455 and 456, or other conductive structures of circuit board 502.

For one embodiment, elastomeric connector sheet 460 is placed over the bus of circuit board 502 and retained between base 410 and the bus of circuit board 502 by fastening base 410 to circuit board 502. For other embodiments, as illustrated in FIGS. 4–7, base 410 may be configured at bottom 412 with a recess 465 for aligning and mounting elastomeric connector sheet 460 between leads 442 and the bus of circuit board 502. Recess 465 may have any suitable dimensions. As one example, recess 465 may have an indentation in bottom 412 of base 410 of approximately 15 mils, for example, a length from left to right of approximately that of slot 420, for example, and a width from front to rear of approximately that of base 410, for example. Elastomeric connector sheet 460 may be fitted in recess 465 and held beneath base 410 when base 410 is fastened to circuit board 502. Clip 430 may also help to retain elastomeric connector sheet 460 in recess 465 as clip 430 may apply pressure over the top of chip 440 in securing chip 440 in base 410. Elastomeric connector sheet 460 may also be glued in recess 465.

With chip socket assembly 400, users may mechanically and electrically couple single chips 440 to a circuit board with relative ease by placing chip 440 in base 410 and attaching clip 430 to base 410 to retain chip 440 in base 410. As chip socket assembly 400 may be used to couple chip 440 to a circuit board without requiring that chip 440 be soldered to the circuit board, users may also remove single chips 440 with relative ease by detaching clip 430 from base 410 and removing chip 440 from base 410. Users may therefore expand the functionality of a system with the granularity of a single chip in a relatively easy manner by adding or replacing single chips in the system. For system 300 of FIG. 3, for example, users may use a separate chip socket assembly 400 to mechanically and electrically couple each DRAM chip of sets 310, 323, 333, 343, and 353 to its respective circuit board 302, 321, 331, 341, and 351. Users may then expand the functionality of system 300 with the granularity of a single chip in a relatively easy manner without having to add or replace an entire circuit board 302, 321, 331, 341, and/or 351, for example.

Figure 8:
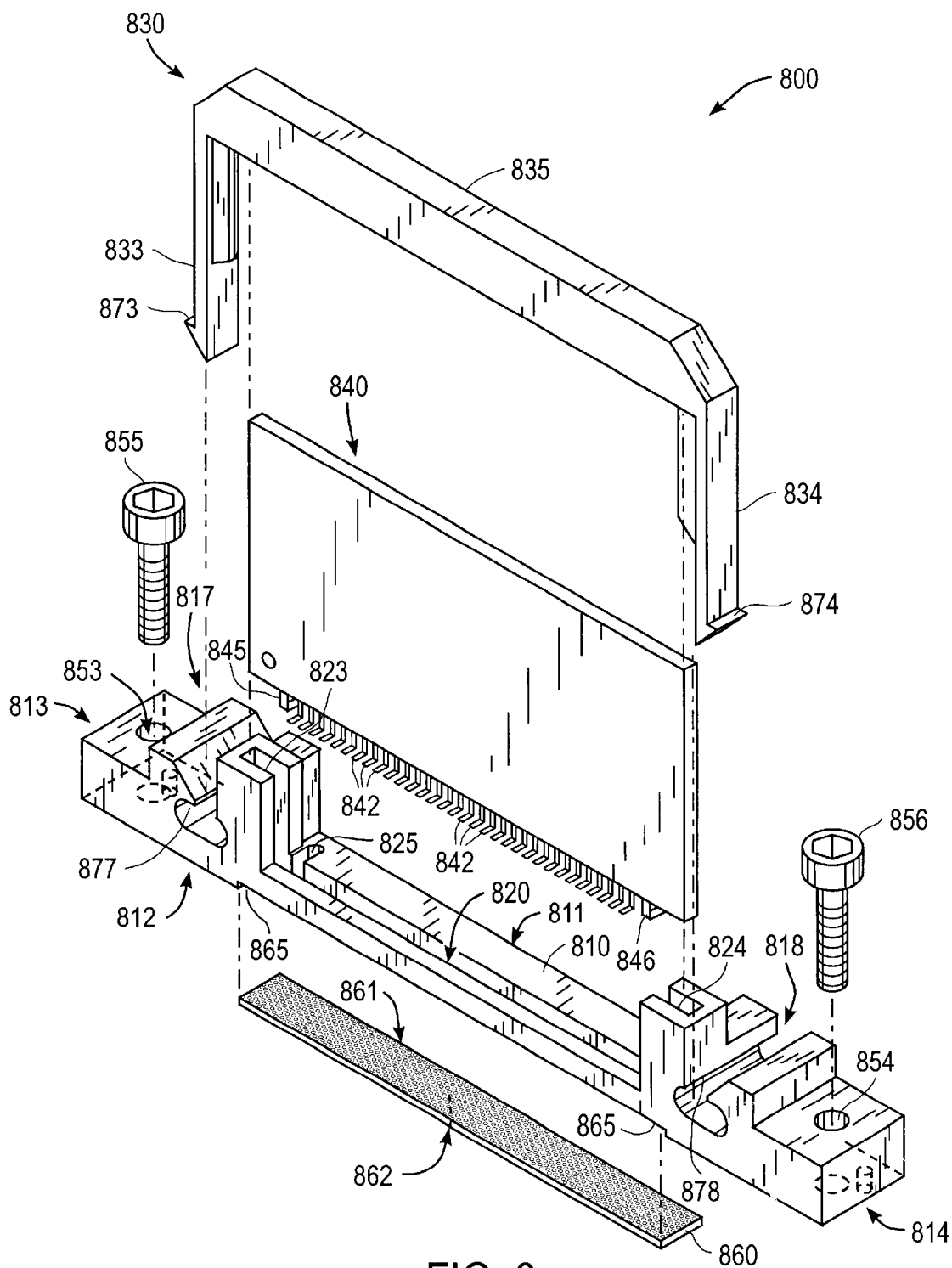
FIG. 8 is an exploded, perspective view of another chip socket assembly.
Figure 10:
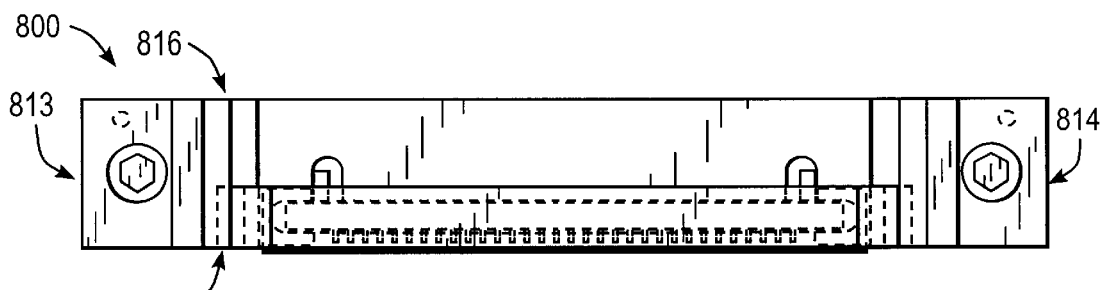
FIG. 10 is a top view of the chip socket assembly of FIG. 9.
Figure 11:
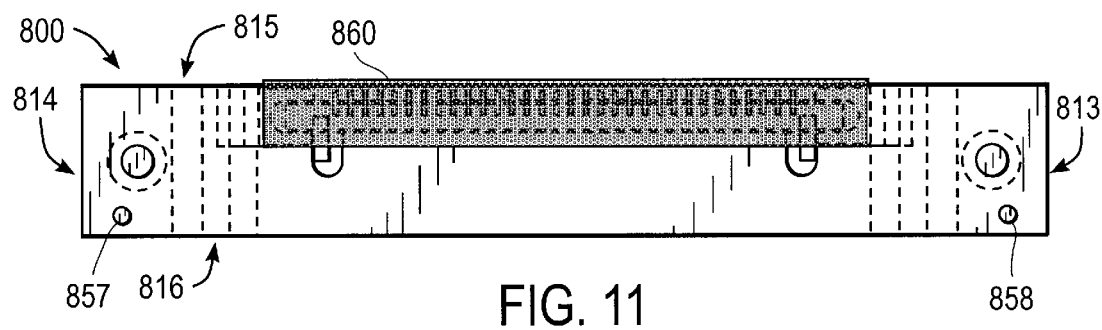
FIG. 11 is a bottom view of the chip socket assembly of FIG. 9.
Figure 9:
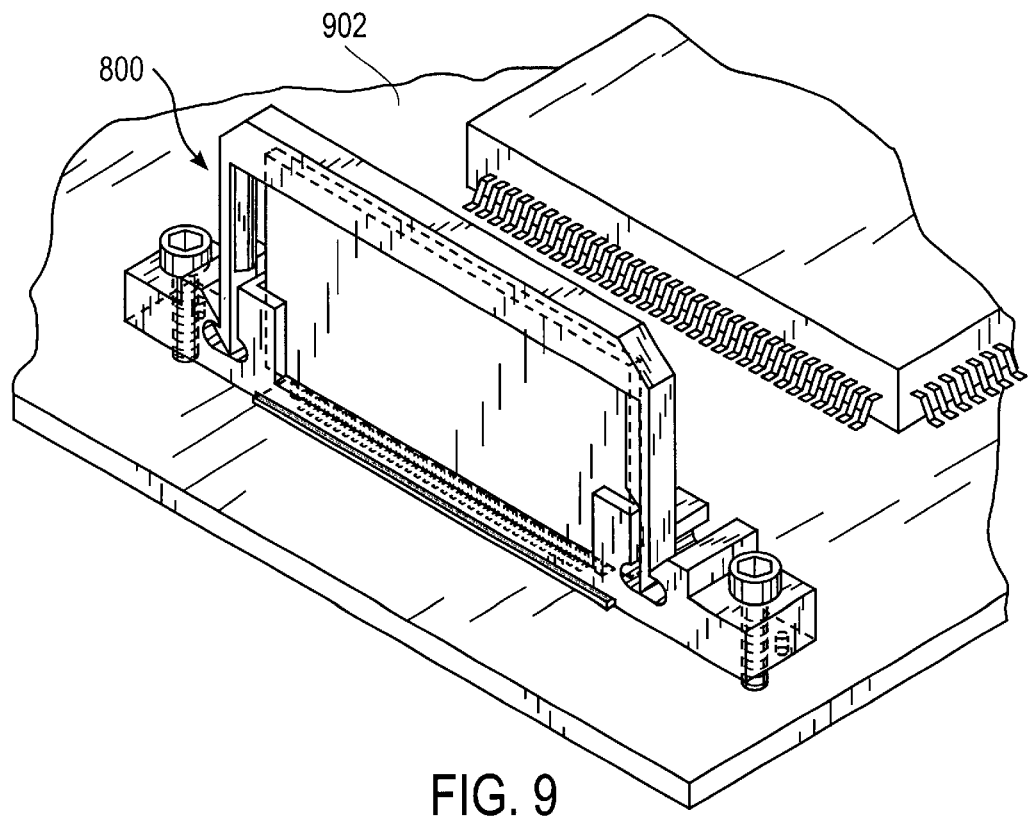
FIG. 9 is a perspective view of the chip socket assembly of FIG. 8 mechanically and electrically coupling a chip to a circuit board.

FIG. 8 is an exploded, perspective view of chip socket assembly 800 which is another embodiment of the present invention. Chip socket assembly 800 is also referred to as a device, an apparatus, or a chip socket, for example. Chip socket assembly 800 may be used to mechanically and electrically couple a chip 840 to a bus of a circuit board 902 as illustrated in FIG. 9. FIG. 10 illustrates a top view of chip socket assembly 800. FIG. 11 illustrates a bottom view of chip socket assembly 800. Chip socket assembly 800 includes a base 810 for receiving and guiding chip 840 and also includes a retaining clip 830 for helping to retain chip 840 in base 810. Elements designated by reference numerals 800–865 and 902 in FIGS. 8–11 are functionally similar to elements 400–465 and 502 of FIGS. 4–7, respectively. Chip socket assembly 800 may be used similarly as chip socket assembly 400.

Base 810 and clip 830 are configured to mate in a different manner as compared to base 410 and clip 430 of FIGS. 4–7. Clip 830 includes a left male connector 833 and a right male connector 834. Base 810 includes a left socket 817 and a right socket 818. Left male connector 833 and left socket 817 may be configured in any suitable manner to mate with one another. Right male connector 834 and right socket 818 may also be configured in any suitable manner to mate with one another.

For one embodiment, left male connector 833 has a protruding ledge 873 and is tapered from left to right from protruding ledge 873 down toward the tip end of left male connector 833. Left socket 817 has an upper lip 877. In connecting clip 830 to base 810, left male connector 833 may be inserted into left socket 817 until protruding ledge 873 snaps in place beneath upper lip 877. Left male connector 833 may be removed from left socket 817 by pushing left male connector 833 inward toward the right until protruding ledge 873 is no longer beneath upper lip 877 while lifting left male connector 833 out of left socket 817.

Right male connector 834 has a protruding ledge 874 and is tapered from left to right from protruding ledge 874 down toward the tip end of right male connector 834. Right socket 818 has an upper lip 878. In connecting clip 830 to base 810, right male connector 834 may be inserted into right socket 818 until protruding ledge 874 snaps in place beneath upper lip 878. Right male connector 834 may be removed from right socket 818 by pushing right male connector 834 inward toward the left until protruding ledge 874 is no longer beneath upper lip 878 while lifting right male connector 834 out of right socket 818.

Although illustrated as having specific configurations for attaching clips 430 and 830 to bases 410 and 810, respectively, other suitable mating configurations may be used for attaching a clip to a base in securing a chip with a chip socket assembly. As one example, the clip and base may be configured such that the clip may be screwed or bolted onto the base.

Figure 12:
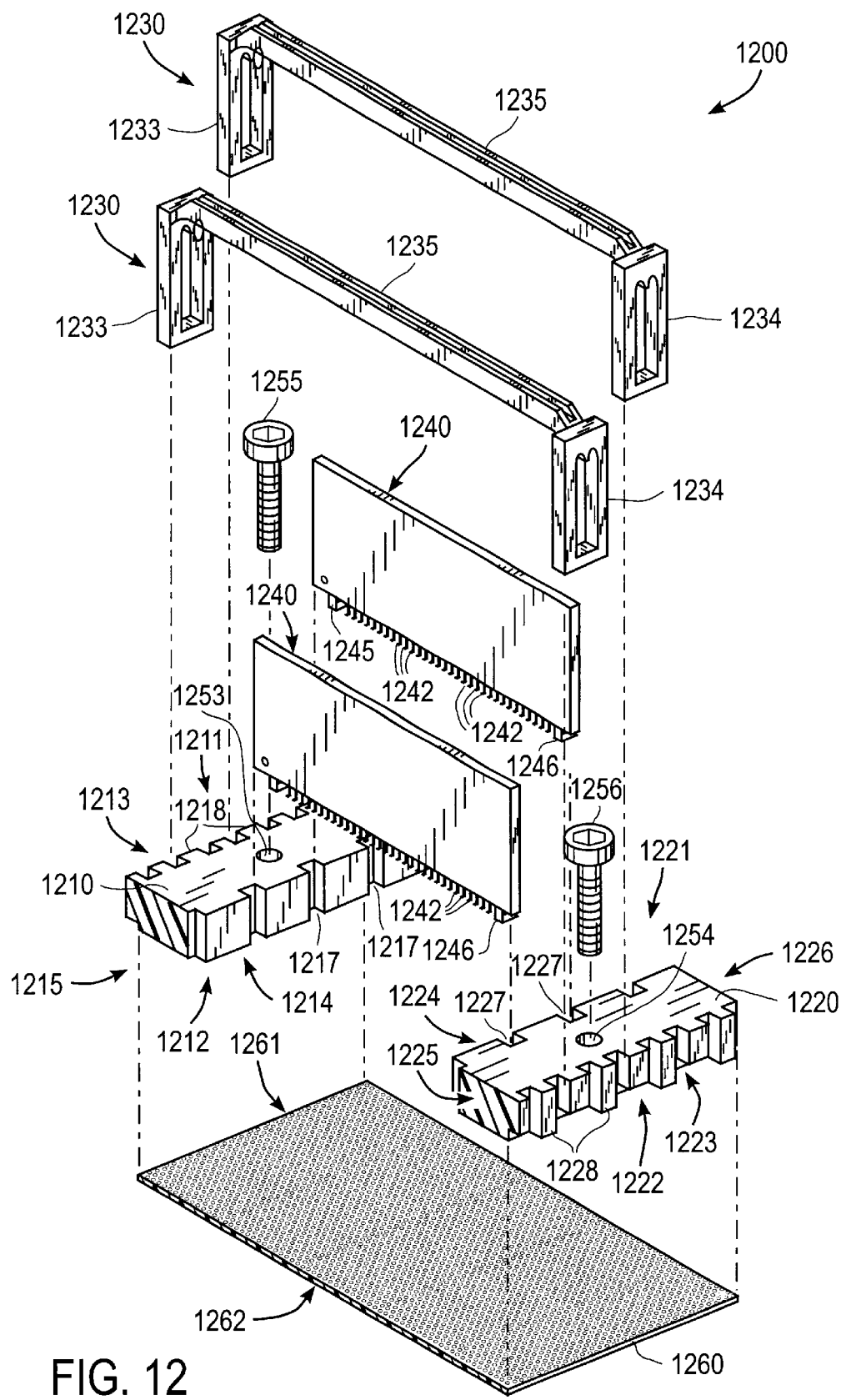
FIG. 12 is an exploded, perspective view of a chip file assembly.
Figure 13:
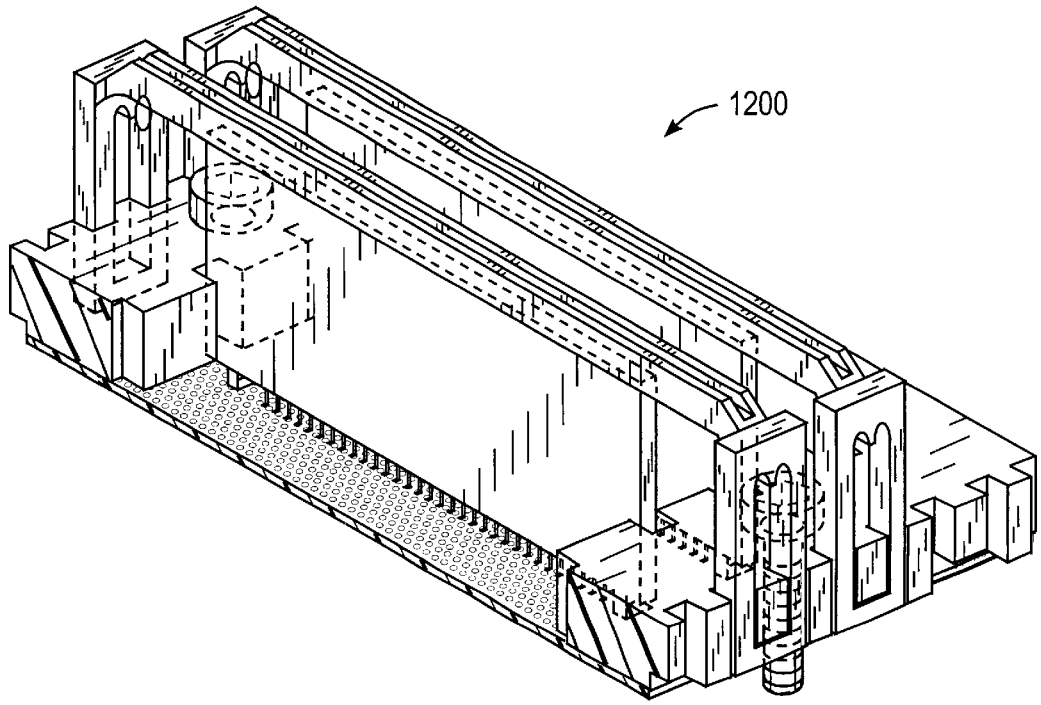
FIG. 13 is another perspective view of the chip file assembly of FIG. 12.
Figure 14:
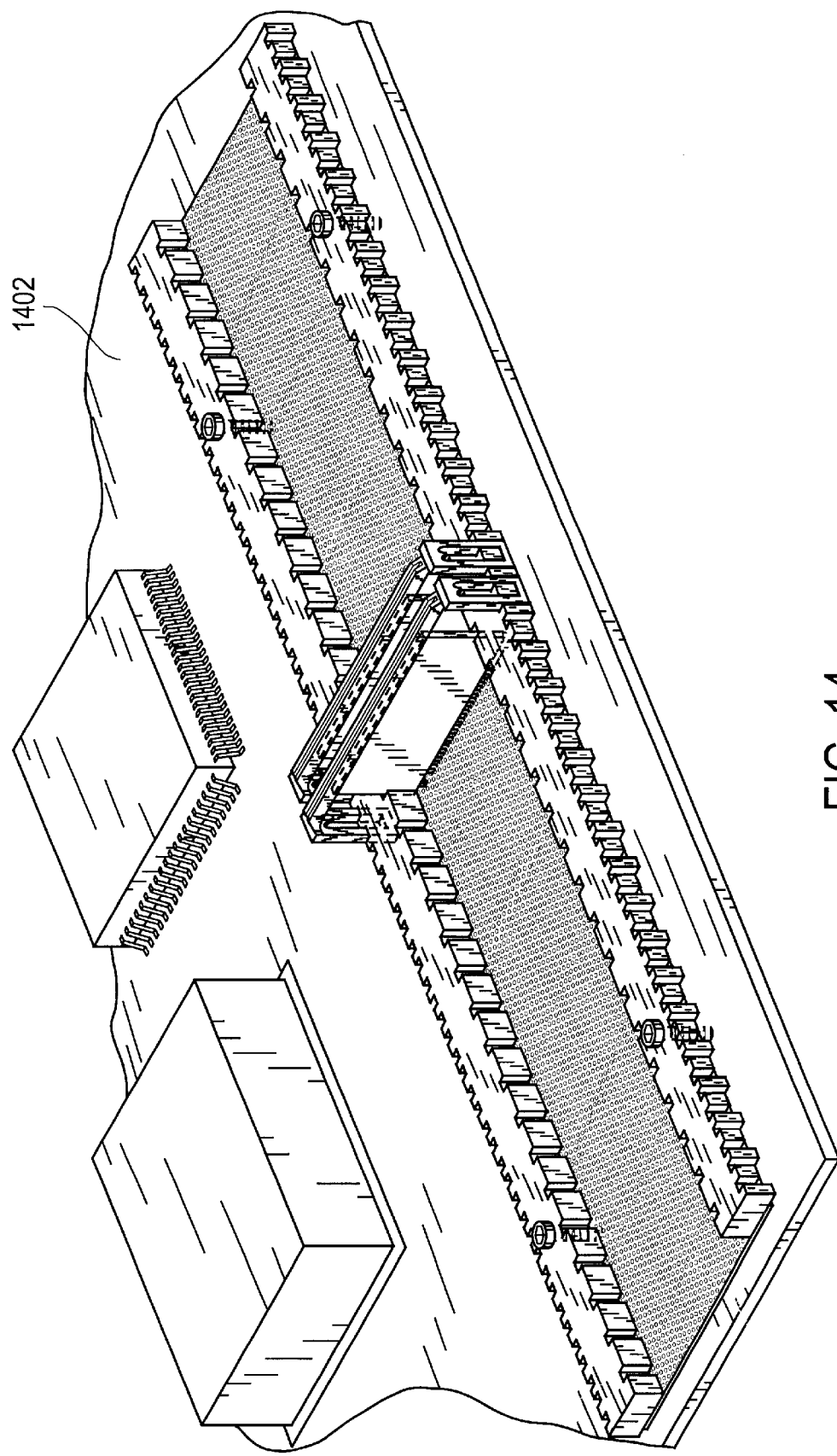
FIG. 14 is a perspective view of a chip file assembly mechanically and electrically coupling two chips to a circuit board.
Figure 15:
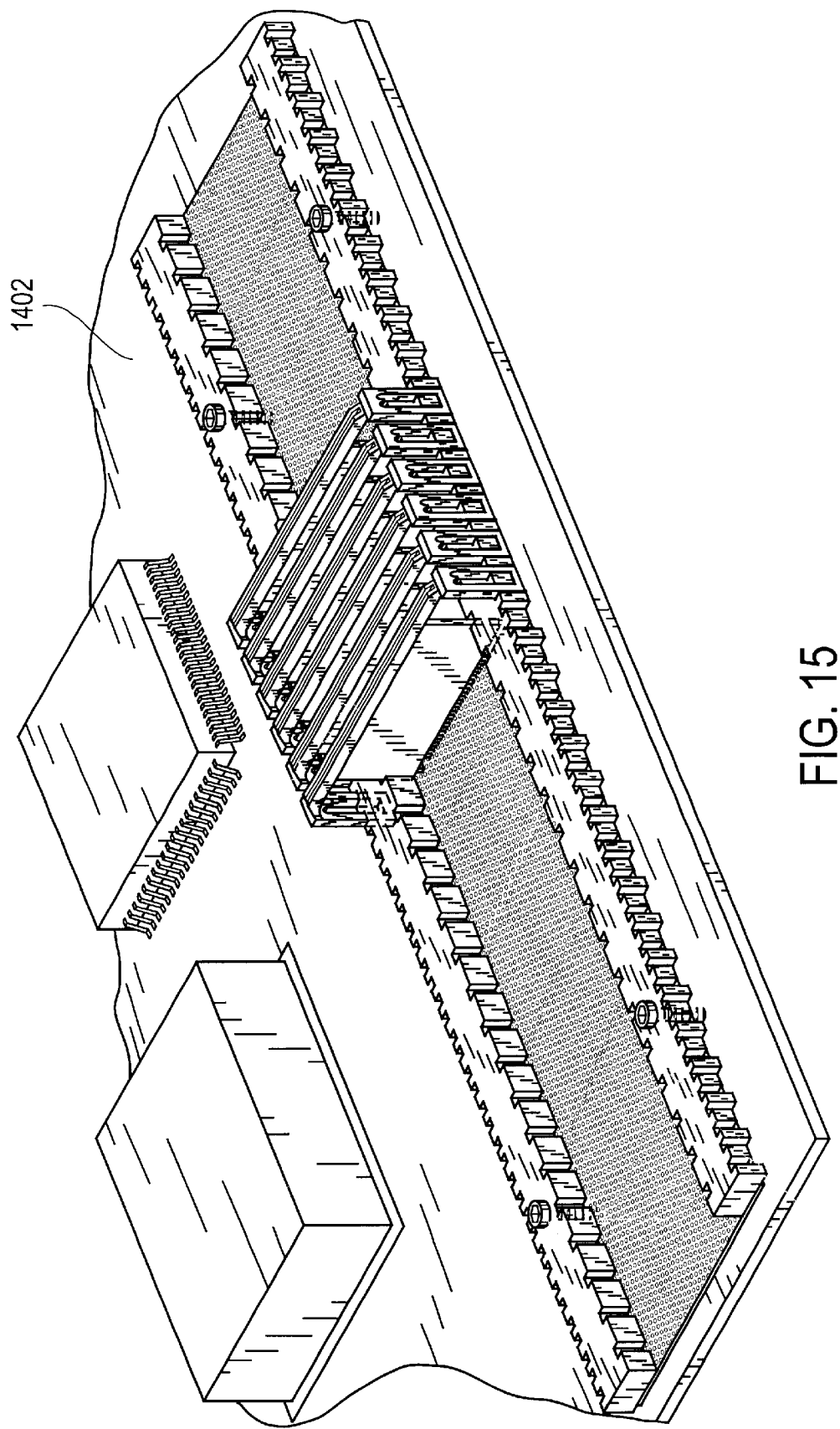
FIG. 15 is a perspective view of a chip file assembly mechanically and electrically coupling six chips to a circuit board.

FIG. 12 illustrates an exploded, perspective view of a chip file assembly 1200. FIG. 13 illustrates a perspective view of chip file assembly 1200 connected together. Chip file assembly 1200 is also referred to as a device, an apparatus, a chip file, or a chip cage, for example. Chip file assembly 1200 may be used to mechanically and electrically couple one or more chips 1240 to one or more buses of a circuit board 1402 as illustrated in FIGS. 14 and 15. FIG. 14 illustrates a perspective view of chip file assembly 1200 mechanically and electrically coupling two chips to circuit board 1402. FIG. 15 illustrates a perspective view of chip file assembly 1200 mechanically and electrically coupling six chips to circuit board 1402.

Chip file assembly 1200 includes a left base portion 1210 and a right base portion 1220 for receiving and guiding one or more chips 1240. Base portions 1210 and 1220 together define a base. Chip file assembly 1200 also includes retaining clips 1230 for helping to retain chips 1240 in base portions 1210 and 1220.

Left base portion 1210 has a top 1211, a bottom 1212 opposite top 1211, an outer side 1213, an inner side 1214 opposite outer side 1213, a front 1215, and a rear 1216 opposite front 1215. Left base portion 1210 may have any suitable dimensions. For one embodiment, left base portion 1210 may have a width from outer side 1213 to inner side 1214 of approximately 400 mils, for example, and a height from top 1211 to bottom 1212 of approximately 200 mils, for example. The length of left base portion 1210 from front 1215 to rear 1216 may vary and may depend, for example, on the desired number of chips 1240 that are capable of being held in chip file assembly 1200. Base portion 1210 may be formed from any suitable material, such as a plastic or metal, for example. Base portion 1210 may be formed with a suitable material so as to serve as a heat sink in coupling chips 1240 to circuit board 1402. Base portion 1210 may be formed so as to conduct heat into circuit board 1402, for example.

Right base portion 1220 has a top 1221, a bottom 1222 opposite top 1221, an outer side 1223, an inner side 1224 opposite outer side 1223, a front 1225, and a rear 1226 opposite front 1225. Right base portion 1220 may have any suitable dimensions. Right base portion 1220 may have a width from outer side 1223 to inner side 1224 of approximately 400 mils, for example, and a height from top 1221 to bottom 1222 of approximately 200 mils, for example. The length of right base portion 1220 from front 1225 to rear 1226 may vary and may depend, for example, on the desired number of chips 1240 that are capable of being held in chip file assembly 1200. Base portion 1220 may be formed from any suitable material, such as a plastic or metal, for example. Base portion 1220 may be formed with a suitable material so as to serve as a heat sink in coupling chips 1240 to circuit board 1402. Base portion 1220 may be formed so as to conduct heat into circuit board 1402, for example.

Inner side 1214 and 1224 are each corrugated with a set of slots or grooves 1217 and 1227, respectively, that traverse inner side 1214 and 1224, respectively, from top 1211 and 1221, respectively, to bottom 1212 and 1222, respectively. The number of slots 1217 and 1227 may vary and may depend, for example, on the desired number of chips 1240 that are capable of being held in chip file assembly 1200. Base portions 1210 and 1220 may each have thirty-two slots for holding thirty-two chips 1240, as illustrated in FIGS. 14–15.

Figure 16:
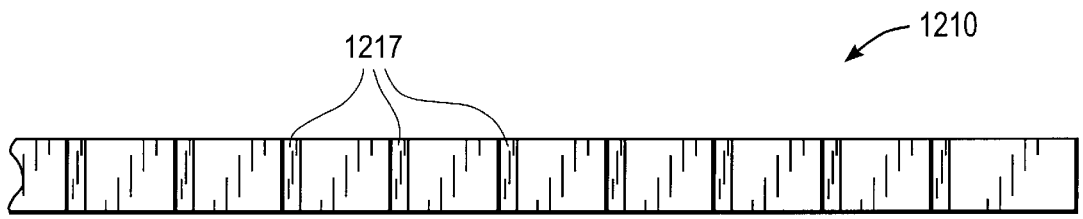
FIG. 16 is an inner side view of the chip file assembly of FIG. 12.

FIG. 16 illustrates inner side 1214 of left base portion 1210. Slots 1217 may each have any suitable size and may be positioned in any suitable location along inner side 1214. For one embodiment, slots 1217 of inner side 1214 may be indented within left base portion 1210 approximately 50 mils, for example, may have a width from front to back of approximately 50 mils, for example, and may be separated from the center of one another by approximately 300 mils, for example. The centers of first and last slots 1217 of inner side 1214 may be separated from front 1215 and rear 1216, respectively, by approximately 375 mils, for example. For a left base portion 1210 having ten slots, for example, the length of left base portion from front 1215 to rear 1216 may be approximately 3450 mils, for example. Inner side 1224 of right base portion 1220 is similarly configured as inner side 1214.

Left base portion 1210 and right base portion 1220 may be positioned such that slots 1217 and 1227 are suitably aligned so as to receive and guide one or more chips 1240, as illustrated in FIGS. 12–15. The above discussion pertaining to chip 440 of FIGS. 4–7 likewise applies to each chip 1240 of FIGS. 12–15. Leads 1242 and support pins 1245 and 1246 correspond to leads 442 and support pins 445 and 446 of FIGS. 4–7. Each slot 1217 is configured to receive at top 1211 a left end of a chip 1240, from the bottom of chip 1240, and to guide the left end of chip 1240 to bottom 1212, as illustrated in FIGS. 12–15. Each slot 1227 is configured to receive at top 1221 a right end of a chip 1240, from the bottom of chip 1240, and to guide the right end of chip 1240 to bottom 1222, as illustrated in FIGS. 12–15.

Base portions 1210 and 1220 may be positioned away from one another by any suitable distance that may depend, for example, on the width of chip 1240. For one embodiment, base portions 1210 and 1220 are positioned away from each other in the range of approximately 900 mils to approximately 1000 mils, for example. Left base portion 1210 and right base portion 1220 may also be positioned with respect to one another such that support pins 1245 and 1246 help to align chip 1240 with respect to base portions 1210 and 1220. Base portions 1210 and 1220 may be positioned such that support pins 1245 and 1246 abut inner sides 1214 and 1224, respectively, when chip 1240 is placed in slots 1217 and 1227.

Clips 1230 help to retain chips 1240 in chip file assembly 1200. Clips 1230 and base portions 1210 and 1220 may be configured to mate with one another in any suitable manner to help retain chips 1240 in chip file assembly 1200.

Figure 17:
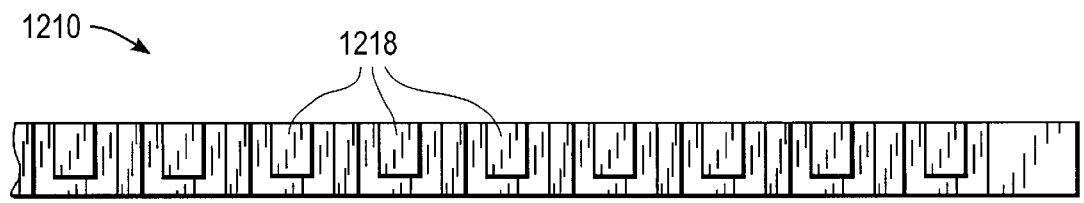
FIG. 17 is an outer side view of the chip file assembly of FIG. 12.

For one embodiment, outer side 1213 and 1223 are each configured with protuberances 1218 and 1228, respectively, that are configured to mate with clips 1230. FIG. 17 illustrates outer side 1213 of left base portion 1210. Protuberances 1218 may each have any suitable size and may be positioned in any suitable location along outer side 1213. Protuberances 1218 are each suitably aligned along outer side 1213 opposite a corresponding slot 1217.

For one embodiment, protuberances 1218 of outer side 1213 each has a width from front 1215 to rear 1216 of approximately 125 mils, for example, a height from top 1211 to bottom 1212 of approximately 150 mils, for example, and a thickness from left to right of approximately 50 mils, for example. Protuberances 1218 may be separated from the center each other by approximately 300 mils, for example. The centers of first and last protuberances 1218 of outer side 1213 may be separated from front 1215 and rear 1216, respectively, by approximately 375 mils, for example. Outer side 1223 of right base portion 1220 is similarly configured as outer side 1213.

Clips 1230 may each have any suitable shape and dimensions that may depend, for example, on the shape and dimensions of protuberances 1218 and 1228, base portions 1210 and 1220, and chip 1240. Clips 1230 may be formed from any suitable material, such as a plastic or metal, for example. Clips 1230 may be formed with a suitable material so as to serve as an integral heat sink in coupling chips 1240 to circuit board 1402. Clips 1230 may further be molded as an integral part of the package for chips 1240.

For one embodiment, each clip 1230 includes a left connector 1233 having an opening to mate with protuberance 1218. Each clip 1230 also includes a right connector 1234 having an opening to mate with protuberance 1228. Each clip 1230 includes a bridge structure 1235 connecting left connector 1233 and right connector 1234. When clip 1230 is connected to mate with base portions 1210 and 1220, bridge structure 1235 overlies chip 1240 and helps to retain chip 1240 in chip file assembly 1200, as illustrated in FIGS. 13–15.

Although illustrated as having specific configurations for attaching clips 1230 to base portions 1210 and 1220, other suitable mating configurations may be used for attaching clips 1230 to base portions 1210 and 1220 in securing chips 1240 with chip file assembly 1200. As one example, clips 1230 and base portions 1210 and 1220 may be configured to mate with one another similarly as clip 830 and base 810 of FIGS. 8–11. As another example, each clip 1230 and base portions 1210 and 1220 may be configured such that clips 1230 may be screwed or bolted onto base portions 1210 and 1220.

In mechanically and electrically coupling one or more chips 1240 to one or more buses of circuit board 1402, as illustrated in FIGS. 14 and 15, base portions 1210 and 1220 are coupled or fastened to circuit board 1402 over suitable pads or other suitable electrical connectors to which each chip 1240 is to be electrically coupled. Base portions 1210 and 1220 may be coupled or fastened to circuit board 1402 in any suitable manner using any suitable structures and techniques.

For one embodiment as illustrated in FIG. 12, base portions 1210 and 1220 may include openings 1253 and 1254, respectively, for coupling base portions 1210 and 1220, respectively, to circuit board 1402. Opening 1253 may receive and guide a bolt or screw 1255 to pass from top 1211 through base portion 1210 to bottom 1212. Opening 1254 may receive and guide a bolt or screw 1256 to pass from top 1221 through base portion 1220 to bottom 1222. Openings 1253 and 1254 may be positioned in any suitable location of base portions 1210 and 1220. Circuit board 1402 may be configured with suitable openings to mate with bolts or screws 1255 and 1256 in fastening base portions 1210 and 1220 to circuit board 1402, as illustrated in FIGS. 14–15. Base portions 1210 and 1220 may be configured with any suitable number of openings for coupling base portions 1210 and 1220 to circuit board 1402. As one example, base portions 1210 and 1220 may each be configured with two openings as illustrated in FIGS. 14–15. For other embodiments, other suitable fasteners such as glue or rivets, for example, may be used to couple base portions 1210 and 1220 to circuit board 1402.

To help align leads 1242 of each chip 1240 with the bonding pads or other suitable electrical connectors to which each chip 1240 is to be electrically coupled, base portions 1210 and 1220 may include one or more suitable alignments pins for aligning base portions 1210 and 1220 with respect to circuit board 1402 to help provide for a suitable electrical connection between each chip 1240 and a bus of circuit board 1402. Although the use of bolts, screws, or rivets, for example, help to align base portions 1210 and 1220 with respect to one or more buses of circuit board 1402 in fastening base portions 1210 and 1220 to circuit board 1402, alignment pins help to ensure leads 1242 of each chip 1240 are suitably aligned within the relatively tighter tolerances required in aligning leads 1242 of each chip 1240 with a bus of circuit board 1402.

For one embodiment, base portions 1210 and 1220 each includes alignment pins that protrude from bottom 1212 and 1222, similar to alignment pins 457 and 458 of FIGS. 5 and 7. Such alignment pins may be positioned in any suitable location of base portions 1210 and 1220. Circuit board 1402 is configured with suitable openings to mate with such alignment pins so as to help ensure leads 1242 of each chip 1240 are suitably aligned with a bus of circuit board 1402. For other embodiments, circuit board 1402 may be configured with suitable alignment pins to mate with suitable openings in base portions 1210 and 1220 to help align leads 1242 of each chip 1240 with a bus of circuit board 1402.

The package of each chip 1240 may be used to help align leads 1242 with a bus of circuit board 1402 by controlling the distance between slots 1217 and 1227 and the positioning of leads 1242 with respect to the package of each chip 1240. For other embodiments, the positioning of support pins 1245 and 1246 with respect to leads 1242 may be controlled for each chip 1240. Base portions 1210 and 1220 in conjunction with support pins 1245 and 1246 may then help to align leads 1242 of each chip 1240 with a bus of circuit board 1402.

Once a chip 1240 is placed in slots 1217 and 1227 and aligned with a bus of circuit board 1402, clip 1230 may be coupled to base portions 1210 and 1220 to help retain chip 1240 between base portions 1210 and 1220. Clip 1230 may also be configured to mate with base portions 1210 and 1220 such that bridge structure 1235 applies pressure over the top of chip 1240 to maintain the electrical connection between leads 1242 of chip 1240 and a bus of circuit board 1402.

For one embodiment, leads 1242 of chip 1240 are placed directly over a bus of circuit board 1402. For other embodiments, a suitable conductive interconnect is used between leads 1242 and a bus of circuit board 1402. As one example, an elastomeric connector sheet 1260 is configured between each chip 1240 and a bus of circuit board 1402 so as to provide for a suitable electrical connection between leads 1242 of chip 1240 and a bus of circuit board 1402. Elastomeric connector sheet 1260 has a top 1261 and a bottom 1262.

Elastomeric connector sheet 1260 is similar to elastomeric connector sheet 460 of FIGS. 4–7. Elastomeric connector sheet 1260 may have any suitable shape and any suitable dimensions. As one example, elastomeric connector sheet 1260 may be rectangular in shape. Elastomeric connector sheet 1260 may have a width from left to right in the range of approximately 1000 mils to approximately 1700 mils, for example, and a thickness from top 1261 to bottom 1262 in the range of approximately 8 mils to approximately 20 mils, for example. Elastomeric connector sheet 1260 may have any suitable length from front to rear that may depend, for example, on the length of base portions 1210 and 1220. Although elastomeric connector sheet 1260 is illustrated as a single sheet, elastomeric connector sheet 1260 may include more than one suitably sized elastomeric connector sheet. As one example, a separate elastomeric connector sheet may be used as an interconnect for each separate chip 1240.

Elastomeric connector sheet 1260 may be mounted between chips 1240 and one or more buses of circuit board 1402 in any suitable manner using any suitable technique. As elastomeric connector sheet 1260 conducts electrical signals only in substantially vertical directions between top 1261 and bottom 1262, elastomeric connector sheet 1260 may be mounted between chips 1240 and one or more buses of circuit board 1402 with minimized concern for electrical shorts, for example, despite accidental electrical contacts made between elastomeric connector sheet 1260 and other conductive structures of chip file assembly 1200, for example bolts or screws 1255 and 1256, or other conductive structures of circuit board 1402, for example.

Elastomeric connector sheet 1260 may be placed over one or more buses of circuit board 1402 and retained beneath base portions 1210 and 1220 by fastening base portions 1210 and 1220 to circuit board 1402. For other embodiments, elastomeric connector sheet 1260 may be sized so as to fit between base portions 1210 and 1220, covering one or more buses of circuit board 1402 without being fastened beneath base portions 1210 and 1220. Elastomeric connector sheet 1260 may then be retained in securing one or more chips 1240 in chip file assembly 1200.

With chip file assembly 1200, users may mechanically and electrically couple one or more chips 1240 to a circuit board with relative ease by placing each chip 1240 between base portions 1210 and 1220 and attaching clip 1230 to base portions 1210 and 1220 to retain each chip 1240 in base portions 1210 and 1220. As chip file assembly 1200 may be used to couple each chip 1240 to a circuit board without requiring that each chip 1240 be soldered to the circuit board, users may also remove single chips 1240 with relative ease by detaching clip 1230 from base portions 1210 and 1220 and removing chips 1240 from base portions 1210 and 1220. Users may therefore expand the functionality of a system with the granularity of a single chip in a relatively easy manner by adding or replacing single chips in the system.

FIG. 18 illustrates a chip socket assembly 1800. Chip socket assembly 1800 is also referred to as a device, an apparatus, or a chip socket, for example. Chip socket assembly 1800 may be used to mechanically and electrically couple a chip 1840 to a bus of a circuit board. Chip socket assembly 1800 includes a base 1810 for receiving and guiding chip 1840. Base 1810 also serves as a retaining clip for helping to retain chip 1840 in base 1810. Chip socket assembly 1800 may be configured and used similarly as chip socket assemblies 400 and 800 of FIGS. 4–11.

Chip socket assembly 1800 is configured to clip or retain chip 1840 in base 1810 in a different manner as compared to base 410 and clip 430 of FIGS. 4–7 and as compared to base 810 and clip 830 of FIGS. 8–11. Base 1810 includes a left clip portion 1817 and a right clip portion 1818. Clip portions 1817 and 1818 may be configured to mate with the package of chip 1840 in any suitable manner.

For one embodiment, left clip portion 1817 includes a socket 1877 having an upper lip. The package of chip 1840 includes a protruding ledge 1833 tapered downward and inward toward a left side of chip 1840. In securing chip 1840 in base 1810, chip 1840 may be pushed down into base 1810 until protruding ledge 1833 snaps in place beneath the upper lip of socket 1877. Chip 1840 may be removed from base 1810 by pushing left clip portion 1817 outward toward the left until protruding ledge 1833 is no longer beneath the upper lip of socket 1877 while lifting chip 1840 from base 1810.

Right clip portion 1818 includes a socket 1878 having an upper lip. The package of chip 1840 includes a protruding ledge 1834 tapered downward and inward toward a right side of chip 1840. In securing chip 1840 in base 1810, chip 1840 may be pushed down into base 1810 until protruding ledge 1834 snaps in place beneath the upper lip of socket 1878. Chip 1840 may be removed from base 1810 by pushing right clip portion 1818 outward toward the right until protruding ledge 1834 is no longer beneath the upper lip of socket 1878 while lifting chip 1840 from base 1810. In short, for the embodiment shown in FIG. 18, clips 1817 and 1818 are relatively flexible. In contrast, chip 1840 and ledges 1833 and 1844 are relatively rigid.

Chip 1840 may configured with a package molded to form protruding ledges 1833 and 1834 as illustrated in FIG. 18. For other embodiments, protruding ledges 1833 or 1834 or other suitable clipping structures may be attached to the package of chip 1840. Base 1810 may be formed from any suitable material, such as a plastic or metal, for example. Base 1810 may be formed with a suitable material so as to serve as a heat sink in coupling chip 1840 to a circuit board. Base 1810 may be formed so as to conduct heat into the circuit board, for example.

Chip file assembly 1200 of FIGS. 12–17 may also be configured with suitable clip portions similar to clip portions 1817 and 1818 of FIG. 18 so as to retain a plurality of chips similar to chip 1840 between base portions 1210 and 1220.

FIG. 19 shows chip socket assembly 1900. Chip socket assembly 1900 is also referred to as a device, an apparatus, or a chip socket, for example. Chip socket assembly includes chip 1914 and base 1910.

Chip 1900 is an edge-mountable vertical chip package with a left arm 1901 and a right arm 1903. Arms 1901 and 1903 are also referred to as clips 1901 and 1903. Clips 1901 and 1903 are relatively flexible, and can be flexed inward when a clip 1900 is being inserted or removed from a base. For one embodiment, chip 1900 can be inserted into a base 1910 that has sockets 1977 and 1978. The ledges 1902 and 1904 of respective arms 1901 and 1903 fit into and are secured by respective sockets 1977 and 1978.

For the embodiment shown in FIG. 19, posts 1917 and 1918 of base 1910 are relatively rigid. Posts 1917 and 1918 are also referred to as clips 1917 and 1918. The insertion and removal of chip 1900 is done by flexing arms 1901 and 1903, which are relatively flexible.

For alternative embodiments, clips 1917 and 1918 of base 1910 are relatively flexible, and arms 1901 and 1903 are also flexible.

Chip file assembly 1200 of FIGS. 12–17 may alternatively be configured with suitable posts similar to posts 1917 and 1918 of FIG. 19 so as to retain a plurality of chips similar to chip 1914.

A chip socket assembly and chip file assembly may be used to mechanically and electrically couple any suitable edge-mountable chip to a bus of a circuit board. As discussed above, suitable SVP packaged chips having L-shaped leads similar to chip 100 of FIGS. 1 and 2 may be mounted over a bus of a circuit board with a chip socket assembly or a chip file assembly. A chip socket assembly and chip file assembly may be used to mount other suitable edge-mountable chips having other suitable lead structures over a bus of a circuit board. As one example, suitable edge-mountable chips having C-shaped leads may also be mounted over a bus of a circuit board with a chip socket assembly or a chip file assembly. FIG. 20 illustrates a side view of an edge-mountable chip 1940 having such C-shaped leads 1942.

As illustrated in FIG. 20, leads 1942 extend from the bottom of chip 1940 and are bent to form a C-shape toward the front side of chip 1940. Leads 1942 extend into a pocket or indentation formed by an extended portion 1941 of chip 1940. The pocket formed by extended portion 1941 helps to protect leads 1942 from being snagged, broken, or bent as a result of any mishaps in handling chip 1940.

Leads 1942 may be formed from any suitable material. As one example, leads 1942 may be formed from a springy metal such that leads 1942 may become relatively compliant when subjected to stress in retaining chip 1940 in a chip socket assembly or in a chip file assembly. For one embodiment, springy leads 1942 are comprised of beryllium-copper. For an alternative embodiment, chip package 1940 can be comprised of molded silicons rubber. For that embodiment, leads 1942 are connected to the molded silicons rubber of chip package 1940. The silicons rubber of chip package 1940 supplies spring force for leads 1942 for that embodiment. The leads 1942 can also have their own additional spring force.

FIG. 21 shows leads 1942 in a compressed state, as exists when chip 1940 is mounted over surface 1943. In the compressed state, leads 1942 electrically and mechanically contact surface 1943. For one embodiment, surface 1943 is an elastomeric connector sheet. For another embodiment, surface 1943 is a metallic surface on a printed circuit board. The metallic surface can, for example, be a bus. A chip socket assembly or chip file assembly may be used to mount a chip 1940 directly over a bus of a circuit board without a separate interconnect, such as an elastomeric connector sheet, and provide for a relatively low inductance connection between leads 1942 and the bus.

For another embodiment, an edge-mountable chip 2040 may have C-shaped leads 2042 that wrap around a cylinder 2080 extending along the bottom of chip 2040 from left to right, as illustrated in FIG. 20. Leads 2042 extend into a pocket or indentation formed by an extended portion 2041 of chip 2040. The pocket formed by extended portion 2041 helps to protect leads 2042 from being snagged, broken, or bent as a result of any mishaps in handling chip 2040.

Leads 2042 may be formed from any suitable springy material. For example, leads 2042 may be comprised of beryllium-copper. Cylinder 2080 may be formed from any relatively compliant material, such as an elastomer, such that leads 2042 may become compliant when subjected to stress in retaining chip 2040 in a chip socket assembly or in a chip file assembly. In this manner, a chip socket assembly or chip file assembly may be used to mount a chip 2040 directly over a bus of a circuit board without a separate conductive interconnect, such as an elastomeric connector sheet, and provide for a relatively low inductance connection between leads 2042 and the bus.

FIG. 23 shows leads 2042 in a compressed state, as exists when chip 2040 is mounted over surface 2043. In the compressed state, leads 2042 electrically and mechanically contact surface 2043. For one embodiment, surface 2043 is a metallic surface on a printed circuit board. For another embodiment, surface 2043 is an elastomeric connector.

Figure 24:
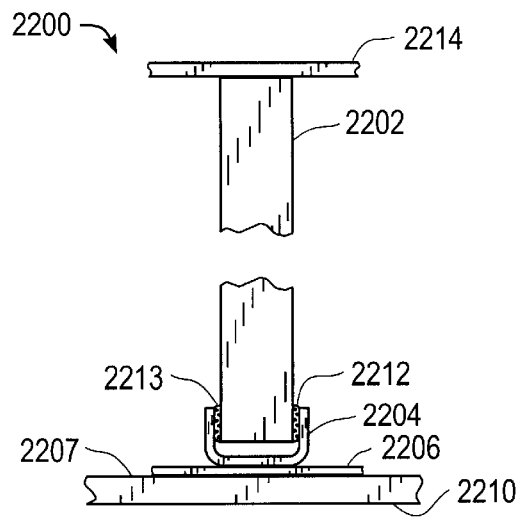
FIG. 24 is a side view of a circuit board with a wrap-around connector coupled to a motherboard.
Figure 25:
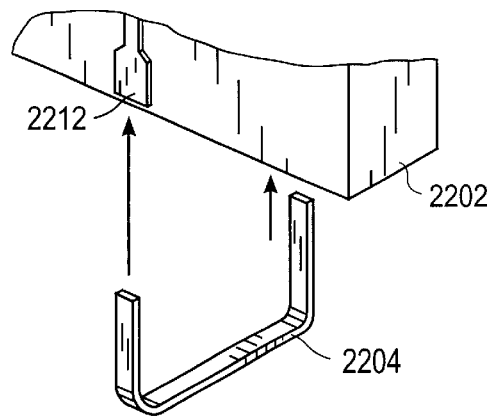
FIG. 25 is an exploded view of wrap-around connector and a lower portion of the circuit board.

Printed circuit boards can be installed in a chip file, according to one embodiment of the present invention. FIG. 24 shows a side view of printed circuit card 2204 installed so as to be electrically coupled to elastomeric connector sheet 2206 and to metallic surface 2207 of a printed circuit mother board 2210. Printed circuit board 2202 is secured by clip 2214. The entire assembly that includes clip 2214, printed circuit board 2202, metallic connector 2204, elastomeric surface 2206, and printed circuit board 2210 is referred to as assembly 2200. Pads 2212 and 2213 reside on printed circuit board 2202. Pads 2212 and 2213 are connected to other circuitry on printed circuit board 2202. As shown in both FIG. 24 and FIG. 25, wrap-around connection 2204 is coupled to pad 2212 and pad 2213. Wrap-around connection 2204 allows electrically connection between pads 2213 and 2212 with conductive surface 2207 on mother board 2210. Assembly 2200 allows printed circuit boards to be connected together and secured with a relatively good connection.

For an alternative embodiment, no elastomeric sheet 2206 is used. Instead, wrap-around connection 2204 directly contacts conductive surface 2207.

Figure 26:
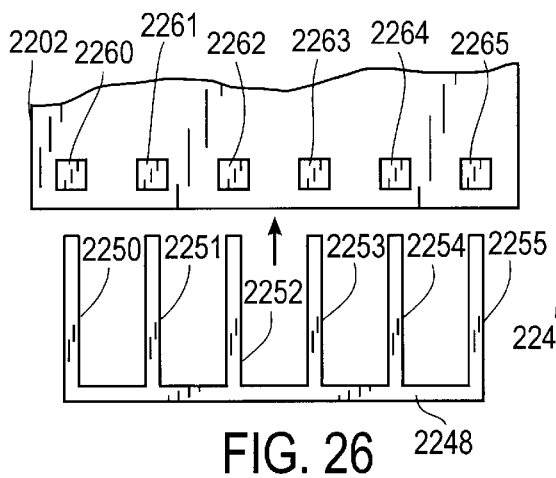
FIG. 26 shows a metal lead frame and connection pads of a circuit board.
Figure 27:
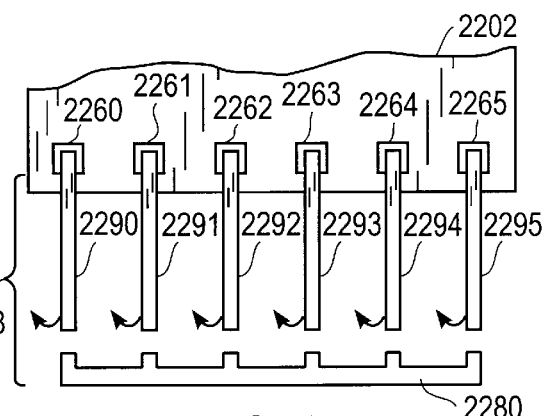
FIG. 27 shows the metal lead frame after being cut, with the leads being soldered to the connection pads of the circuit board of FIG. 26.

FIGS. 26 and 27 show a method for assembling a wrap around connector with the pads of printed circuit board. FIG. 26 shows metallic lead frame 2248 having arms 2250 through 2255. Arms 2250 through 2255 are soldered to respective pads 2260 through 2265 of printed circuit board 2202.

As shown in FIG. 27, portion 2280 is cut away from the rest of metal lead frame 2248. This results in metal strips 2290 through 2295 being attached to pads 2260 through 2265, but not being attached to metal piece 2280.

Metal leads 2290 through 2295 are each then wrapped around the bottom printed circuit board 2202 to be attached to the other side. For one embodiment of the present invention, respective pads reside on the other side of printed circuit board 22. Metal leads 2290 through 2295 are then soldered to those metallic pads residing on the other side of printed circuit board 2202. For an alternative embodiment of the present invention, a plastic housing resides on the other side of printed circuit board 2202 and the ends of leads 2290 through 2295 are wrapped around so that end of those leads reside within the plastic housing (not shown).

The result of the process shown in FIGS. 26 through 27 is, for one embodiment of the invention, structure 2200 shown in FIG. 24.

Figure 28:
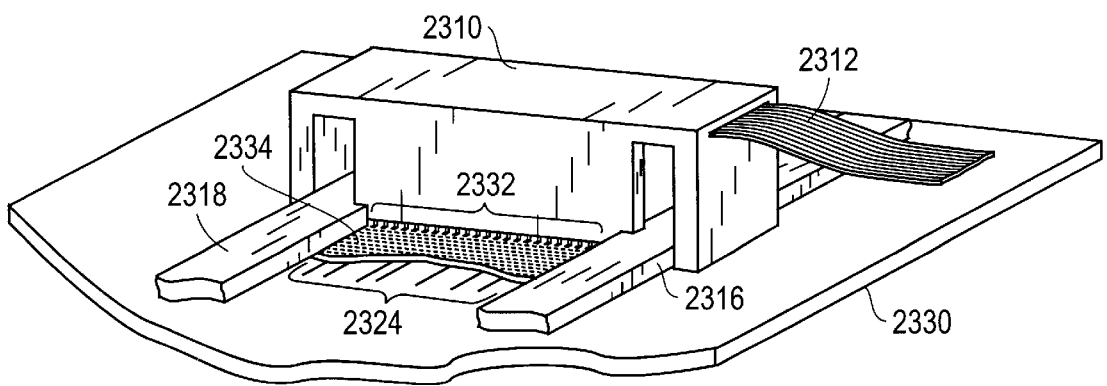
FIG. 28 shows a vertically-mounted chip package with a ribbon connector connected to the upper portion of the chip package.

FIG. 28 shows an embodiment of the invention wherein a chip file is used for general purpose function expansion in addition to memory expansion. FIG. 28 shows integrated circuit 2310 secured in a left socket (or base) 2318 and a right socket (or base) 2316.

Leads 2332 of integrated circuit package 2310 are connected to the top of elastomeric connector sheet 2334. Elastomeric connector sheet 2334 allows current to flow in a vertical direction and prevents the shorting together of leads 2332. Elastomeric connector 2334 allows current to flow into strips 2324 of printed circuit board 2330. For one embodiment of the present invention, strips 2324 carry bus signals for a computer system. Printed circuit board 2330 carries other signals on various other metallic strips to other circuitry.

For one embodiment of the invention, ribbon cable 2312 is connected to an integrated circuit residing inside of integrated circuit package 2310. For one embodiment of invention, ribbon cable 2312 is comprised of a number of metallic signal lines and carries non-bus signals. For various embodiments, the non-bus signals carried by ribbon connector 2312 include video signals, keyboard signals, disk drive signals, or other types of signals that differ from the bus signals carried by connective strips 2324.

The integrated circuit package 2310 of FIG. 28 can be secured to left socket 2318 and right socket 2316 by clips or other techniques. For an alternative embodiment of the present invention, the connection between leads 2332 and signal lines 2324 can be done directly without the use of elastomeric connector sheet 2334. For that alternative embodiment, care must be exercised that there are no shorts between the various leads, so each of the strips 2324 needs to be relatively narrow.

For still other embodiments, a suitable edge-mountable chip having leads or other suitable electrical connectors on the top edge of the chip, for example, may be mounted over a bus of a circuit board using a chip socket assembly or a chip file assembly. A separate bus formed, for example, with conductive elastomer may then be coupled to the electrical connectors on the top edge of the chip. For various embodiments, a clip such as clip 430 (see FIG. 4), 830 (see FIG. 8), and 1230 (see FIG. 12), for example, may be configured to mount the separate bus over the top edge of the chip. The underside of the bridge structure of the clip may have suitable pads, for example, for electrical connection to the top edge of the chip. A suitable conductive interconnect, such as an elastomeric connector sheet, for example, may be configured between the top edge of the chip and the underside of the bridge structure to help provide for the electrical connection between the separate bus and the chip. For other embodiments, other suitable techniques may be used to couple the separate bus to the chip.

The separate bus may be used, for example, to carry video signals, keyboard signals, disk drive signals, or other suitable signals between the chip and any suitable component, such as a CRT, keyboard, or disk drive, for example, operatively coupled to the separate bus. In this manner, the chip socket assembly and the chip file assembly may be used to provide for the addition, removal, or replacement of enhanced system functionality in a relatively easy manner.

Figure 29:
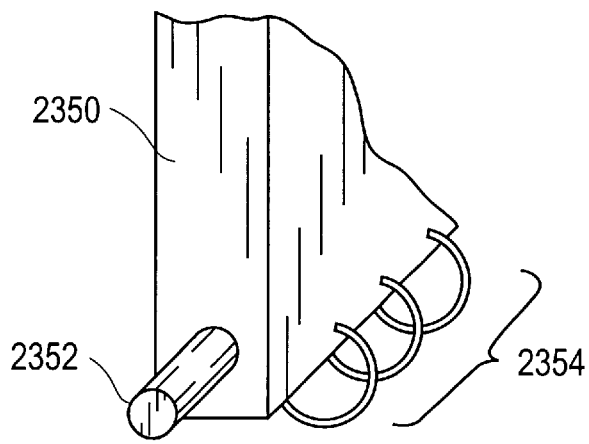
FIG. 29 shows a cam follower and leads of a vertical chip package.
Figure 30:
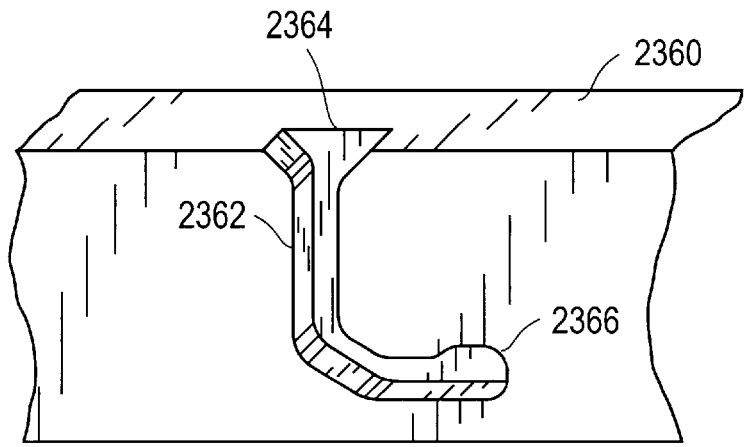
FIG. 30 shows a slot molded into a chip file base.
Figure 31:
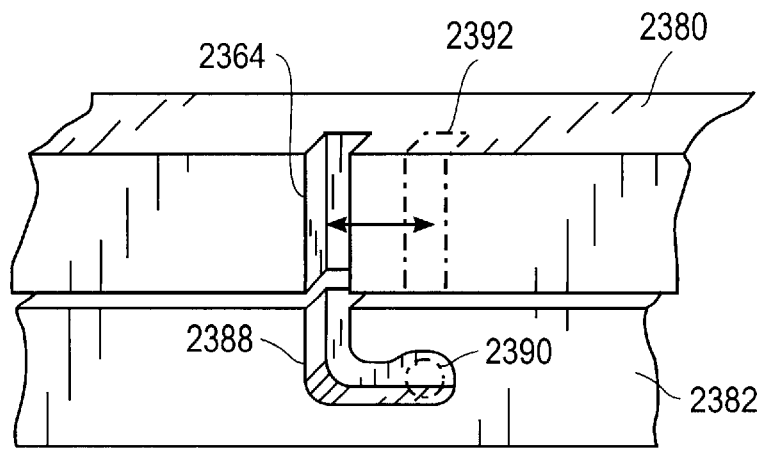
FIG. 31 shows a sliding card guide over a chip file base.

There can be better reliability if a metallic lead of an integrated circuit wipes against another conductive surface during the insertion of that integrated circuit into a socket. FIGS. 29, 30, and 31 illustrate embodiments of the invention that permit a wiping action between a lead and a metallic surface the lead is to be connected to. The metallic surface can be the top of a elastomeric connection sheet or the top of a metal bus of a motherboard, for example. In FIG. 29, a cam follower 2352 is shown as being connected to an integrated circuit chip package 2350. The integrated circuit chip package has leads 2354 at its bottom. The integrated circuit 2350 has cam follower 2352 on each side of the integrated circuit chip package for one embodiment of the present invention. For other embodiments, there is only one cam follower 2352 at one side of the integrated circuit chip package 2350.

For one embodiment of the invention, integrated circuit chip package 2350 is positioned so that cam follower 2352 is inserted into slot 2362, which is also referred to as notch 2362 or passageway 2362. For the way things are illustrated in FIGS. 29 and 30, integrated circuit 2350 would be turned 180 degrees. For one embodiment of the invention, however, integrated circuit chip package would have another cam follower at the other sides, meaning that the integrated circuit 2350 would not need to be turned.

Slot 2362 has a wider opening 2364 at the top, for one embodiment. Slot 2362 has a wider opening 2366 at the end of slot 2362. Slot 2362 is part of chip file 2360 or socket 2360. In other words, structure 2360 can be a chip file or an individual socket. Slot 2362 is molded into socket 2360. As shown in FIG. 30, slot 2362 has a relatively flat surface towards the end 2366. As cam follower 2362 travels through slot 2362, leads 2354 accordingly move downward and then in a horizontal direction as cam follower 2352 moves from opening 2364 to the end of 2366 of slot 2362. The horizontal travel of cam follower 2352 causes leads 2354 to move in a horizontal direction over the top of conductive elastomeric connector (not shown) that resides on top of a metallic strip or bus on a printed circuit board. A wiping action of leads 2354 as they move horizontally along the top of the elastomeric connector results in a cleaning action and a buffing action with respect to the leads and the elastomeric connection. This can result in a better electrical connection between leads 2354 and the top of the elastomeric connection. This in turn can result in maximizing the reliability of the connection between loads 2354 and the elastomeric connector (if one is present), and the metallic surface of printed circuit board.

Slot 2362 shown in FIG. 30 also holds integrated circuit 2352 in the chip file or socket. In other words, integrated circuit 2350 is secured by the placement of cam follower 2352 in the end portion 2366 of slot 2362.

FIG. 31 shows another embodiment of the present invention that allows a wiping motion of leads against either an elastomeric connection or the metallic surface itself of a printed circuit board. The embodiment shown in FIG. 31 includes a sliding beam 2380 that includes a vertical slot 2362. For one embodiment, slider 2380 is made of plastic. For other embodiments, other materials are used, including metal.

Slider 2380 resides on top of base 2382. Base 2382 is constructed of plastic and includes slot 2388 that includes an end portion 2390. End portion 2390 of FIG. 31 has a wider opening in relation to slot 2388 in order to limit and secure the travel of a cam follower.

For the embodiment of FIG. 31, an integrated circuit chip (not shown) would have two cam followers—one residing near the bottom side of the integrated circuit, as shown in FIG. 29, and an additional cam follower residing farther up the side of the integrated circuit so that cam follower residing farther up the side of the integrated circuit would fit into socket 2386 of slider 2380. The lower cam follower of the integrated circuit would fit into slot 2388 of the base unit 2382. When slider 2380 is moved to left or to the right, the integrated circuit is pushed to the left or the right because the cam follower residing in slot 2386 is moved to the left or to the right. This in turn makes the lower cam follower move to the left or the right in the bottom of slot 2388, until the lower cam follower hits the end portion 2390.

As the cam follower moves through the final stages along slot 2388, the cam follower moves in a substantially horizontal direction. This causes the lower leads of a vertical integrated circuit package to move in a horizontal direction, which in turn causes the leads to wipe against either the elastomeric connection, if one is present, or the metallic surface of the printed circuit board, if no elastomeric connector is present. In any event, there is a wiping action with respect to the leads during the horizontal travel period, which as discussed above, improves the reliability of the electrical connection between the leads and either the elastomeric connector (if one is present), or the metallic surface of the printed circuit board.

According to one embodiment of the invention, base unit 2360 shown in FIG. 30 resides on both sides of the integrated circuit. For another embodiment, base unit 2360 with its slot 2362 resides only on the left side or the right side of the base unit that secures the integrated circuit package. The same applies to the embodiment shown in FIG. 31. For one embodiment, there is a slider 2380 and a base unit 2382 on one side of the integrated circuit. For another embodiment, both sides of the base unit have slots similar to slots 2386 and 2388. Slots 2362 and 2386 would be positioned such that the horizontal direction would be the same if both sides of a chip file or base includes slots.

For one embodiment, slider 2380 and base 2382 are part of a chip file that includes several vertical DRAMS. When slider 2380 is moved to the left or to the right, all the DRAMS in the chip files that are inserted into the slots move to the left or to the right. This means that all the leads of all the DRAMS experience a horizontal wiping action at once. This allows for better reliability and better connection for the DRAMS in all the chip files. This also facilitates manufacturing and assembly of a DRAM chip file, given that slider 2380 allows all the DRAMS to experience wiping at once.

Figure 32:
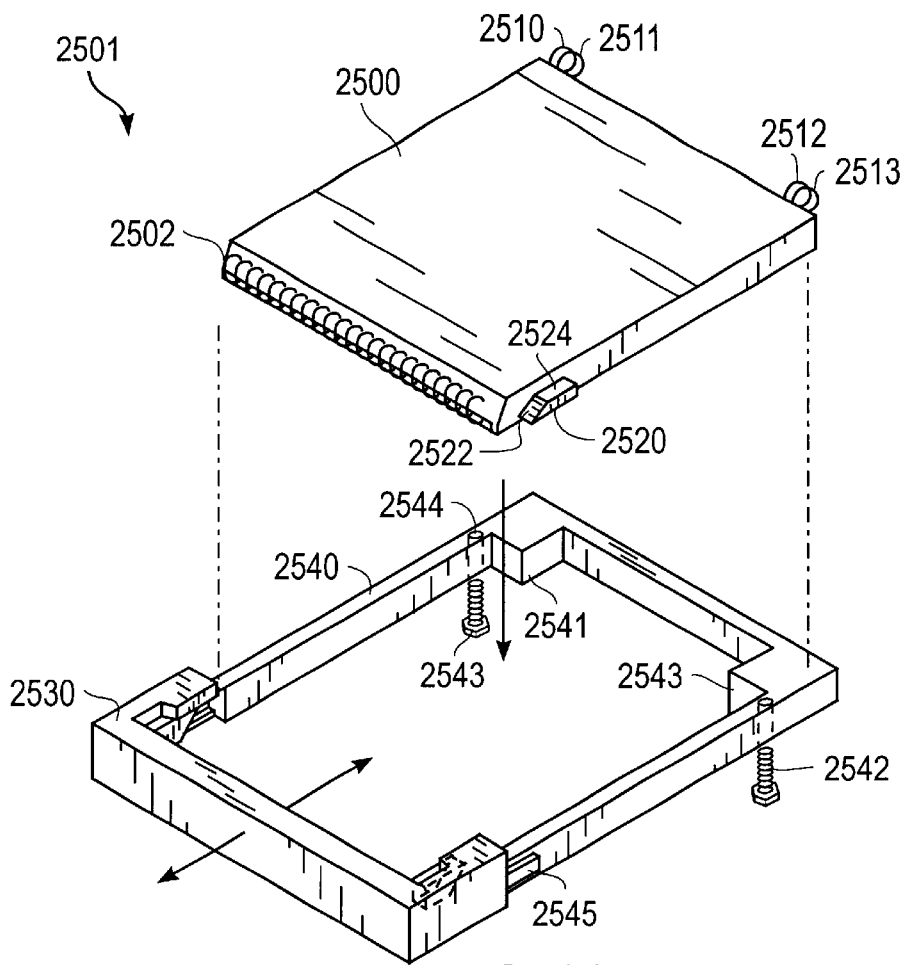
FIG. 32 shows a horizontal chip package with side wedges, together with a socket and frame for receiving the horizontal chip package.
Figure 33:
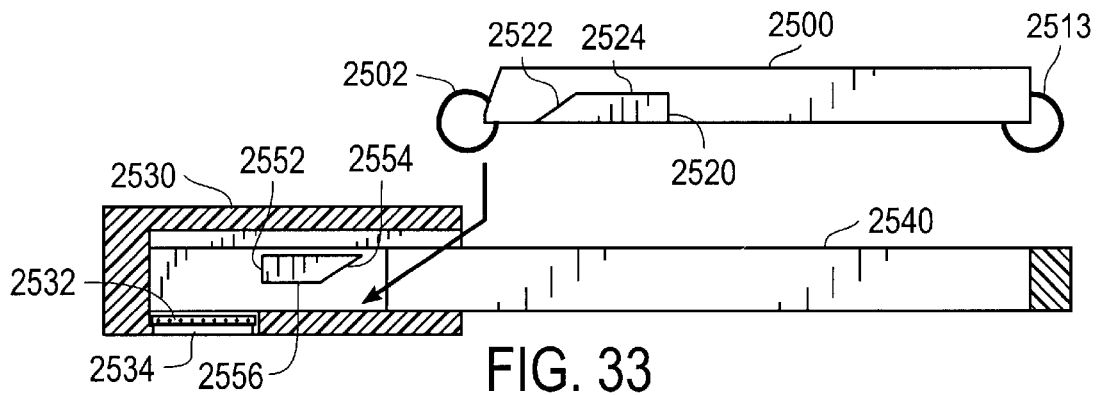
FIG. 33 is a side view of the horizontal chip package and a side cut-away view of the socket and frame shown in FIG. 32.
Figure 34:
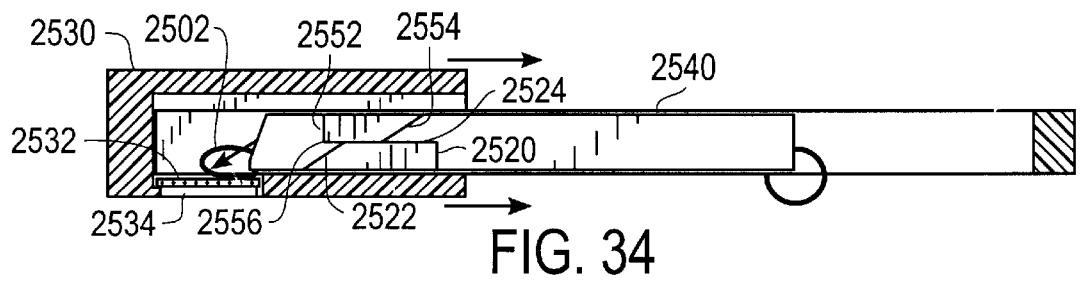
FIG. 34 is a side view of the horizontal chip package inserted in the socket and frame shown in FIG. 33.

FIGS. 32, 33, and 34 show an embodiment of the invention for connection of a surface horizontal package ("SHP"). FIG. 32 shows assembly 2501 that includes surface horizontal package 2500, frame 2540 (also referred to as socket 2540), and plastic securing member (base) 2530.

Surface horizontal package 2500 includes substantially C-shaped leads 2502 that reside on one side of the horizontal chip package 2500. Horizontal chip package 2500 also includes mechanical support pins 2510 and 2511 at the left side of the horizontal package, and mechanical support pins 2512 and 2513 at the right side of the end of horizontal package 2500. Horizontal package 2500 includes an integrated circuit mounted inside of a plastic package, wherein the leads of the integrated circuit are connected to leads 2502 of package 2500.

Horizontal package 2500 also includes wedge 2520 that has a ramped surface 2522 and a flat top surface 2524. Wedge 2520 is also referred to as ramp 2520. For one embodiment of the invention, wedge 2520 is on one side of the chip package and another wedge is shown on the other side of the chip package (not shown). For an alternative embodiment of the invention, there is only one wedge 2520 at one side of the horizontal chip package 2500. But for the embodiment shown in FIG. 32 there are two wedges, one of which is not shown.

Mechanical pins 2510, 2511, 2512, and 2513 are used to provide vertical and horizontal alignment when horizontal chip package is inserted into frame 2540. Frame 2540 has square projections 2541 and 2543 that jut into the interior of frame 2540. Mechanical pins 2510 through 2513 are inserted between portions 2541 and 2543 of frame 2540.

For one embodiment of the invention, frame 2540 is secured to the top of a printed circuit board by using bolts 2542 and 2544.

For one embodiment, surface horizontal package 2500 contains a DRAM. For an alternative embodiments, surface horizontal package 2500 contains a Rambus DRAM or any other type of integrated circuit.

Base 2530 is also referred to as sliding member 2530. Sliding member 2530 is constructed of plastic for one embodiment of the invention. For other embodiments, other materials can be used. Sliding member 2530 can slide horizontally forward and backward above the printed circuit board. For one embodiment, sliding member 2530 moves along guide rail 2545. For one embodiment there is a corresponding guiderail on the other side of frame 2540.

FIG. 33 shows a cross-sectional side view of sliding member 2530 and frame 2540. Sliding member 2530 includes a wedge extension 2552 that includes a slope surface 2554 and a flat surface 2556. When horizontal package 2500 is inserted into frame 2540, the wedge 2520 of package 2500 contacts wedge 2552. Given that surfaces 2522 and 2554 are ramps, wedges 2520 and 2552 move past each other such that surfaces 2524 an 2556 soon contact each other and face each other. The sloped faces of wedges 2522 and 2554 causes chip package 2500 to move downward within frame 2540. This action is caused by sliding member 2530 being moved in a direction towards the back of frame 2540. As shown in FIG. 33, the movement of member 2530 is in a right hand direction.

As sliding surface 2522 moves along 2554 horizontal package 2500 moves in a downward direction. The result of this downward direction is shown in FIG. 34. FIG. 34 shows that faces 2556 and 2524 face each other. The result of this is that leads 2502 are compressed and make a good electrical contact with the top of elastomeric connector sheets 2532. Elastomeric connector sheet 2532 is connected to metallic surface 2534 of a printed circuit board.

Thus, assembly 2501 allows a horizontal chip package 2500 to be securely stationed within a frame on a printed circuit board and have the leads 2502 make good electrical contact with elastomeric connector 2532, which in turn is connected to the metallic surface of the printed circuit board. For an alternative embodiment of the invention, elastomeric connector 2532 is omitted and leads 2502 make direct contact with surface 2534 of the printed circuit board. Metallic surface 2534 is connected to other circuitry and other lines of the printed circuit board, and also connected to other circuitry of a computer system, for example.

It is to be appreciated that the assembly 2501 permits a wiping action as the wedges 2520 and 2552 contact each other and as sliding member 2530 moves in a direction towards frame 2540. Assembly 2501 also permits a secure arrangement that aligns and holds horizontal chip package 2500 within frame 2540. Mechanical pins 2510 and 2513 contact areas 2541 and 2543 to provide alignment. Mechanical pins 2511 and 2512 contact frame 2540. Alignment is thereby secured.

For other embodiments of the invention, other types of projections or surfaces could be used in place of wedges 2520 and 2552.

For other embodiments of the invention, horizontal chip file 2500 has different types of leads 2502. For one embodiment, leads 2502 are not C-shaped, but are instead merely substantially horizontal leads that are slightly bent or merely horizontal.

For the embodiment shown in FIG. 32, however, C-shaped leads 2502 are flexible and compressible. For one embodiment, leads 2502 are made of beryllium-copper.

Figure 35:
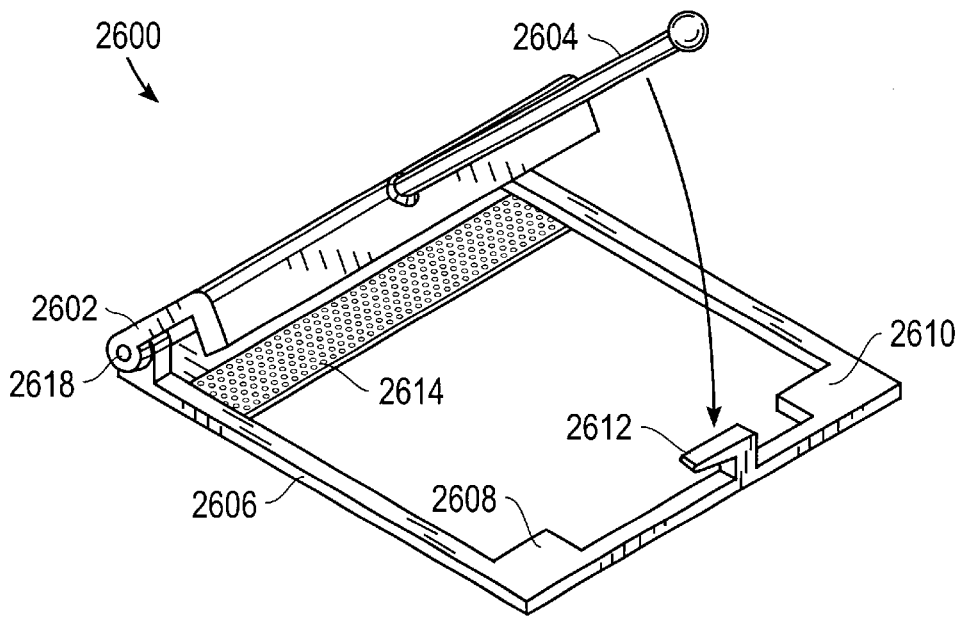
FIG. 35 is a perspective view of a socket with a lever and clamp.
Figure 36:
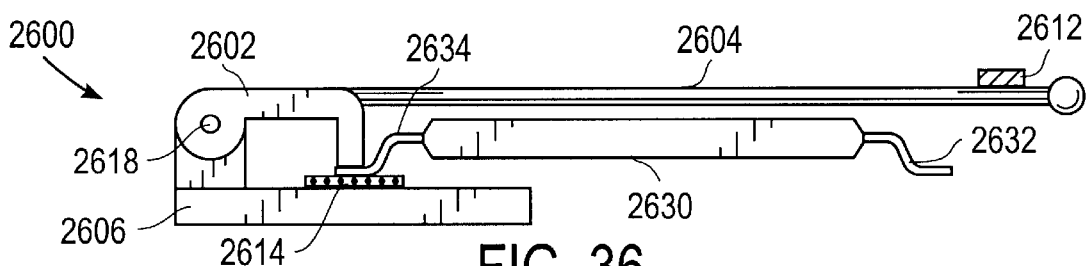
FIG. 36 is a side cut-away view of the socket of FIG. 35 with a horizontal chip package secured in the socket.

FIGS. 35 and 36 show a clam shell type socket for securing a surface horizontal package ("SHP") integrated circuit. For one embodiment of the invention, the integrated circuit could be a Rambus DRAM or other type of DRAM. For other embodiments, any other horizontal packaged integrated circuit can be secured by socket 2600.

Socket or assembly 2600 includes a hinged clamp 2602 that rotates about axis 2618. Elastomeric connector 2614 resides underneath hinged clamp 2602. Hinged clamp 2602 is coupled via axis 2618 to frame 2606. Frame 2606 includes a latch 2612 and filled-in corner portions 2608 and 2610. Filled-in corner portions 2608 and 2610 are used to help secure a horizontal chip package that is placed within frame 2606.

Lever arm 2604 is connected to hinged clamp 2602. When lever arm 2604 is moved downward, the hinged clamp 2602 also moves downward. Lever arm 2604 is secured by latch 2612. For one embodiment of the invention, lever arm 2604, hinged clamp 2602, frame 2606, and latch 2612 are made of plastic. For one embodiment, lever arm 2604 is made of flexible plastic such that lever arm 2604 can be bent to be secured by latch 2612. For another embodiment, latch 2612 is likewise made of flexible plastic so that both lever arm 2604 and latch 2612 can flex in order to secure lever arm 2604 within latch 2612.

FIG. 36 shows a side cut-away view of clam shell socket 2600. A horizontal chip package 2630 is secured by assembly 2600. For one embodiment, chip 2630 is a surface horizontal package. Surface horizontal package 2630 includes electrical leads 2634. Horizontal chip package 2630 also includes securing pins 2632 on the other side of the horizontal chip package. Mechanical securing pins 2632 reside between filled in corners 2608 and 2610 shown in FIG. 35.

Electrical leads 2634 are secured by hinged clamp 2602. Leads 2634, so secured, are pushed down against the top of elastomeric connector sheet 2614. Elastomeric 2614 is in turn pressing against a metallic surface of a printed circuit board. The printed circuit board is the printed circuit board that frame 2606 is secured to.

Thus, the clam shell socket 2600 is a way for holding and securing a horizontal chip package. The chip package stays secured as long as lever arm 2604 resides within latch 2612. The chip package can be removed from assembly 2600 by releasing the lever arm from latch 2612. Filled-in corners 2608 and 2610 contact mechanical pins 2632, allowing horizontal chip package 2630 to be properly aligned within frame 2606. The ends of mechanical alignment pins 2632 contact against the end of plastic frame 2602 providing another alignment mechanism to keep horizontal chip package aligned within frame 2606.

For an alternative embodiment of the invention, horizontal chip package 2630 can have leads at both ends, which means that an elastomeric sheet would be used at both ends of frame 2606.

Figure 37:
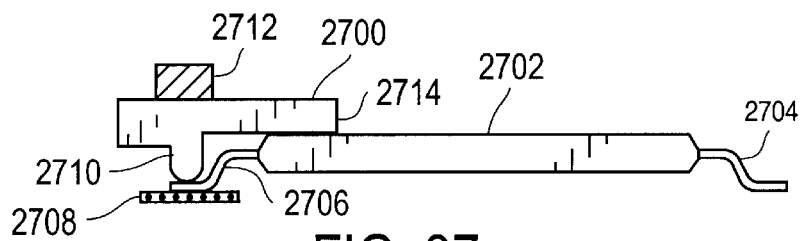
FIG. 37 is a side view of a clip with a perpendicular member that secures a horizontal chip package.

FIG. 37 illustrates another way to secure a surface horizontal package ("SHP") 2702 to a printed circuit board. Horizontal chip package 2702 includes mechanical alignment pins 2704 and electrical leads 2706. Horizontal package 2702 is secured by means of a clip 2700 that is secured by a locking tab 2712 that is connected to a base, which in turn is connected to a printed circuit board. Clip 2700 includes a beam portion 2714 that is horizontal and that juts out over the top of horizontal chip package 2702. Clip 2700 also includes a downward member 2710 that presses against the top of leads 2706. Leads 2706 are thereby pressed securely on top of elastomeric connector 2708. Elastomeric connector 2708 is in turn connected to a metallic surface of a printed circuit board.

For one embodiment of the invention, clip 2700 is a one piece plastic clip that is removable. A horizontal chip package 2702 can be removed from its secure installation by pushing beam 2714 upward. Likewise, horizontal chip package is secured by placing the horizontal chip package 2702 under clip 2700 and pushing beam 2714 downward to the point where the position shown in FIG. 37 is achieved.

For an alternative embodiment, clip 2714 can be attached to chip 2702 or integrally molded to chip package 2702. For one embodiment, clip 2700 is made of thermally enhanced plastic to allow heat dissipation. For another embodiment, clip 2700 is an integrated heat sink for chip 2702. For that embodiment, clip 2700 is constructed of metal in order to dissipate heat.

Figure 38:
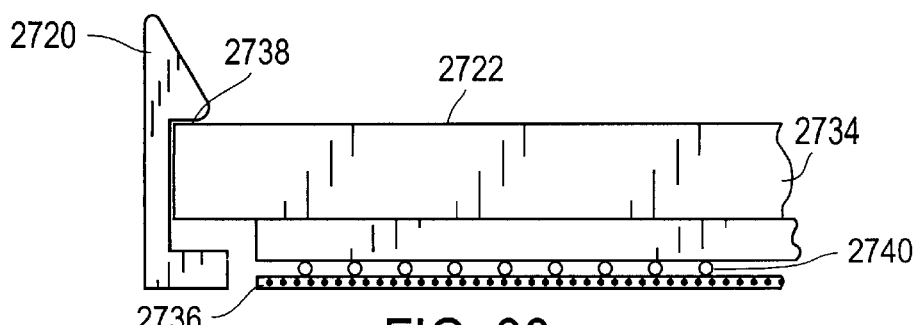
FIG. 38 is a side view of a planar clip secured by a tab in a base, together with a horizontal chip package that is secured by the clip.

FIG. 38 shows another way of securing a horizontal chip package 2734. For the embodiment shown in FIG. 38, a tab 2720 secures a clip 2722, that in turn resides on top of horizontal chip package 2734. Tab 2720 includes a notch 2738 under which clip 2722 resides.

For one embodiment of the invention, clip 2722 is substantially planar and constructed of plastic. For another embodiment, clip 2722 is integrally molded to chip 2734 and made of plastic.

For another embodiment, clip 2722 is made of metal to allow heat dissipation. For yet another embodiment, clip 2722 is constructed of thermally enhanced plastic.

When clip 2722 resides under notch 2738 of tab 2724, horizontal chip package 2734 has its leads 2740 pressed against and compressed with respect to elastomeric connector 2736. This allows a relatively good electrical connection between leads 2724 and elastomeric connector 2736. Elastomeric connector 2736 is in turn connected to the metallic surface of a printed circuit board.

Horizontal chip package is removed by moving clip 2722 to the right so that no portion of clip 2722 resides underneath the notch of tab 2720. When clip 2722 is released, this in turn releases horizontal chip package 2734.

In order to secure chip 2734, clip 2722 is placed on top of 2734 and clip 2722 is secured underneath tab 2720 by having clip 2722 reside within notch 2738. Again, this secures horizontal chip package 2734 and allows for a relatively good electrical connection.

In the foregoing description, the invention has been described with reference to specific exemplary embodiments thereof. It will, however, be evident that various modifications and changes may be made thereto without departing from the broader spirit or scope of the present invention. The specification and drawings are, accordingly, to be regarded in an illustrative rather than a restrictive sense.

What is claimed is:

1. An assembly comprising:
   (a) a horizontal chip package that includes a member on a side of the horizontal chip package;
   (b) a base to receive the horizontal chip package, wherein the base includes a guiding surface to guide the member of the horizontal chip package in an angled downward direction; and (c) a frame configured to mate with the base to secure the horizontal chip package in the base, wherein the frame is coupled to a horizontal circuit board having a first conductive region, wherein a lead of the horizontal chip package is electrically coupled to the first conductive region of the circuit board when the horizontal chip package is secured in the frame and the base further comprising an elastomeric connector sheet electrically coupling the lead of the horizontal chip package and the first conductive region of the circuit board, wherein a bottom of the elastomeric connector sheet physically contacts the first conductive region of the circuit board, wherein a top of the elastomeric connector sheet physically contacts the lead of the horizontal chip package, wherein when the guiding surface of the base guides the member of the horizontal chip package in the angled downward direction, the lead wipes the top of the elastomeric connector sheet.

2. The assembly of claim 1, wherein the base is movable with respect to the circuit board and wherein the frame is rigidly secured to the circuit board.

3. The assembly of claim 1, wherein the lead of the horizontal chip package physically contacts the first conductive region of the circuit board, wherein when the guiding surface of the base guides the member of the horizontal chip package in the angled downward direction, the lead wipes the top of the elastomeric connector sheet.

4. The assembly of claim 1, wherein the lead of the horizontal chip package is a substantially C-shaped lead that is compressible.

5. The assembly of claim 1, wherein the lead of the horizontal chip package is substantially horizontal with respect to the horizontal chip package.

6. The assembly of claim 2, wherein the frame includes a guide rail for mating the base to the frame, wherein the base is movable along the guide rail.

7. The assembly of claim 1, wherein the horizontal chip package includes support pins, wherein when the horizontal chip package is secured in the frame and the base, the support pins contact the frame to provide alignment of the horizontal chip package within the frame.

8. The assembly of claim 1, wherein the horizontal chip package includes a dynamic random-access memory.

9. A base assembly comprising:
  (a) a sliding member to receive a horizontal chip package with a member on a side of the horizontal chip package, wherein the sliding member includes a guiding surface to guide the member of the horizontal chip package in an angled downward direction;
  (b) a frame configured to mate with the sliding member such that the sliding member slides horizontally with respect to the frame, the frame for securing to a horizontal circuit board having a conductive region to couple to a lead of the horizontal chip package.

10. The base assembly of claim 9, wherein the guiding surface of the sliding member includes a ramp and wherein the member on the side of the horizontal chip package includes a ramp.

11. The base assembly of claim 9, wherein the frame includes a surface configured to contact mechanical support pins of the horizontal chip package to provide alignment of the horizontal chip package within the base assembly.

12. The base assembly of claim 9, wherein the frame includes a guide rail configured to mate with the sliding member.

13. The base assembly of claim 9, wherein the horizontal chip package includes a dynamic random access memory.

* * * * *

UNITED STATES PATENT AND TRADEMARK OFFICE
CERTIFICATE OF CORRECTION

PATENT NO.    : 6,352,435 B1
DATED         : March 5, 2002
INVENTOR(S)   : Perino et al.

It is certified that error appears in the above-identified patent and that said Letters Patent is hereby corrected as shown below:

Column 17,
Line 40, replace "silicons" with -- silicone --.
Line 42, replace both occurrences of "silicons" with -- silicone --.

Signed and Sealed this

Eleventh Day of March, 2003

JAMES E. ROGAN
*Director of the United States Patent and Trademark Office*